United States Patent
Park et al.

(10) Patent No.: US 12,218,043 B2
(45) Date of Patent: *Feb. 4, 2025

(54) INTERPOSER, SEMICONDUCTOR PACKAGE INCLUDING THE SAME, AND METHOD OF FABRICATING THE INTERPOSER

(71) Applicant: Samsung Electronics Co., Ltd., Suwon-si (KR)

(72) Inventors: Yukyung Park, Hwaseong-si (KR); Ungcheon Kim, Cheonan-si (KR); Sungwoo Park, Seongnam-si (KR); Seungkwan Ryu, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

This patent is subject to a terminal disclaimer.

(21) Appl. No.: 17/971,321

(22) Filed: Oct. 21, 2022

(65) Prior Publication Data

US 2023/0052195 A1     Feb. 16, 2023

Related U.S. Application Data

(63) Continuation of application No. 17/038,306, filed on Sep. 30, 2020, now Pat. No. 11,482,483.

(30) Foreign Application Priority Data

Dec. 6, 2019     (KR) .................. 10-2019-0161836

(51) Int. Cl.
*H01L 23/498*     (2006.01)
*H01L 21/48*     (2006.01)
(Continued)

(52) U.S. Cl.
CPC .... *H01L 23/49827* (2013.01); *H01L 21/4853* (2013.01); *H01L 21/486* (2013.01);
(Continued)

(58) Field of Classification Search
CPC ......... H01L 23/49827; H01L 23/49838; H01L 21/486
See application file for complete search history.

(56) References Cited

U.S. PATENT DOCUMENTS 7,906,363 B2     3/2011     Koyanagi
7,998,860 B2     8/2011     Li et al.
(Continued)

FOREIGN PATENT DOCUMENTS

JP     2007096232 A     4/2007
JP     2010157703 A     7/2010
(Continued)

OTHER PUBLICATIONS

Office Action dated Aug. 13, 2024 for corresponding KR Patent Application No. 10-2019-0161836.
(Continued)

*Primary Examiner* — Dale E Page
*Assistant Examiner* — Wilner Jean Baptiste
(74) *Attorney, Agent, or Firm* — Muir Patent Law, PLLC

(57)     ABSTRACT

Provided is an interposer for a semiconductor package, the interposer including an interposer substrate comprising a first main surface and a second main surface opposite to the first main surface, a first through-electrode structure and a second through-electrode structure each passing through the interposer substrate and protruding from the first main surface, a connection terminal structure contacting both the first through-electrode structure and the second through-electrode structure, and a photosensitive polymer layer arranged between the connection terminal structure and the
(Continued)

interposer substrate, and between the first through-electrode structure and the second through-electrode structure.

20 Claims, 38 Drawing Sheets

(51) Int. Cl.
*H01L 23/538* (2006.01)
*H01L 25/18* (2023.01)
*H01L 23/544* (2006.01)

(52) U.S. Cl.
CPC .... *H01L 23/49838* (2013.01); *H01L 23/5385* (2013.01); *H01L 25/18* (2013.01); *H01L 23/544* (2013.01)

(56) References Cited

U.S. PATENT DOCUMENTS

| | | | |
|---|---|---|---|
| 8,263,497 | B2 | 9/2012 | Andry et al. |
| 9,691,685 | B2 | 6/2017 | Lee et al. |
| 9,698,051 | B2 | 7/2017 | Chun et al. |
| 10,128,224 | B2 | 11/2018 | Park et al. |
| 10,163,771 | B2 | 12/2018 | Zuo et al. |
| 10,204,893 | B2 | 2/2019 | Uzoh et al. |
| 11,848,307 | B2 * | 12/2023 | Park .................. H01L 23/49833 |
| 2007/0076348 | A1 * | 4/2007 | Shioga .................. H01G 4/232 |
| | | | 361/307 |
| 2013/0037946 | A1 | 2/2013 | Kim et al. |
| 2013/0221493 | A1 | 8/2013 | Kim et al. |
| 2016/0005706 | A1 | 1/2016 | Park |
| 2016/0351472 | A1 | 12/2016 | Park et al. |
| 2018/0218966 | A1 | 8/2018 | Choi et al. |
| 2019/0006317 | A1 | 1/2019 | Yu et al. |

FOREIGN PATENT DOCUMENTS

| | | |
|---|---|---|
| JP | 2013538460 A | 10/2013 |
| JP | 5354765 B2 | 11/2013 |
| JP | 5500464 B2 | 5/2014 |
| JP | 2018207104 A | 12/2018 |
| JP | 2019530973 A | 10/2019 |
| KR | 101095373 B1 | 12/2011 |
| KR | 1020160139815 A | 12/2016 |
| KR | 1020170094026 A | 8/2017 |
| KR | 1020190018173 A | 2/2019 |

OTHER PUBLICATIONS

First Office Action for corresponding JP Patent Application No. 2020-202008, dated Dec. 3, 2024.

* cited by examiner

INTERPOSER, SEMICONDUCTOR PACKAGE INCLUDING THE SAME, AND METHOD OF FABRICATING THE INTERPOSER

CROSS-REFERENCE TO RELATED APPLICATION

This application is a continuation of U.S. application Ser. No. 17/038,306 filed on Sep. 30, 2020 which claims the benefit of Korean Patent Application No. 10-2019-0161836, filed on Dec. 6, 2019, in the Korean Intellectual Property Office, the disclosure of which is incorporated by reference herein in its entirety.

BACKGROUND

The inventive concept relates to an interposer, a semiconductor package including the interposer, and a method of fabricating the interposer, and more particularly, to an interposer, a semiconductor package including the interposer, and a method of fabricating the interposer with reduced fabricating costs by greatly simplifying a fabricating process.

With an increasing need for miniaturization and high speed, various packaging techniques have been attempted and applied for semiconductor chips. For example, an interposer of a 2.5-dimensional (2.5D) package is manufactured through a complex fabrication process, which results in high costs. Therefore, it is desirable to reduce the fabrication costs by simplifying the fabrication process.

SUMMARY

The inventive concept provides an interposer that may be manufactured with reduced fabrication costs by largely simplifying a fabrication process.

The inventive concept also provides a semiconductor package that may be manufactured with reduced fabrication costs by largely simplifying a fabrication process.

The inventive concept provides a method of fabricating an interposer with reduced fabrication costs by largely simplifying a fabrication process.

According to an aspect of the inventive concept, there is provided an interposer for a semiconductor package, the interposer including an interposer substrate including a first main surface and a second main surface opposite to the first main surface, a first through-electrode structure and a second through-electrode structure each passing through the interposer substrate and protruding from the first main surface, a connection terminal structure contacting both the first through-electrode structure and the second through-electrode structure, and a photosensitive polymer layer arranged between the connection terminal structure and the interposer substrate, and between the first through-electrode structure and the second through-electrode structure.

According to another aspect of the inventive concept, there is provided a semiconductor package including a package substrate, an interposer arranged on the package substrate, and a first semiconductor device and a second semiconductor device that are arranged to at least partially overlap the interposer, in which the interposer includes an interposer substrate that includes a first main surface facing the package substrate and a second main surface opposite to the first main surface, a first through-electrode structure and a second through-electrode structure each passing through the interposer substrate and protruding from the first main surface, a passivation layer on side surfaces of protruding portions of the first through-electrode structure and the second through-electrode structure and on the first main surface, a photosensitive polymer layer provided on the passivation layer between the first through-electrode structure and the second through-electrode structure, and a connection terminal structure contacting both the first through-electrode structure and the second through-electrode structure.

According to another aspect of the inventive concept, there is provided a semiconductor package including a package substrate, an interposer arranged on the package substrate, and a first semiconductor device and a second semiconductor device that are arranged to at least partially overlap the interposer, in which the package substrate includes a base layer, a top connection pad provided on a top surface of the base layer, and a bottom connection pad provided on a bottom surface of the base layer, the interposer includes an interposer substrate that includes a first main surface facing the package substrate and a second main surface opposite surface to the first main surface, a first through-electrode structure and a second through-electrode structure each passing through the interposer substrate and protruding from the first main surface, a passivation layer on side surfaces of protruding portions of the first through-electrode structure and the second through-electrode structure and on the first main surface, a photosensitive polymer layer provided on the passivation layer between the first through-electrode structure and the second through-electrode structure, and a connection terminal structure contacting both the first through-electrode structure and the second through-electrode structure and being connected with the top connection pad of the package substrate, and the first semiconductor device includes a memory device including a plurality of stacked memory chips and the second semiconductor device includes a memory controller configured to control the memory device.

According to another aspect of the inventive concept, there is provided a method of fabricating an interposer for a semiconductor package, the method including forming a first through-electrode structure and a second through-electrode structure on an interposer substrate including a first main surface and a second main surface opposite surface to the first main surface, wherein the first through-electrode structure and the second through-electrode structure each protrude from the first main surface, forming a passivation layer on exposed portions of the first through-electrode structure and the second through-electrode structure and the first main surface, forming a photosensitive polymer layer on the passivation layer, partially removing the passivation layer and the photosensitive polymer layer at the same time to expose conductor plug portions of the first through-electrode structure and the second through-electrode structure, and forming a connection terminal structure that contacts the conductor plug portion of the first through-electrode structure, the conductor plug portion of the second through-electrode structure, and a residual photosensitive polymer layer between the first through-electrode structure and the second through-electrode structure.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
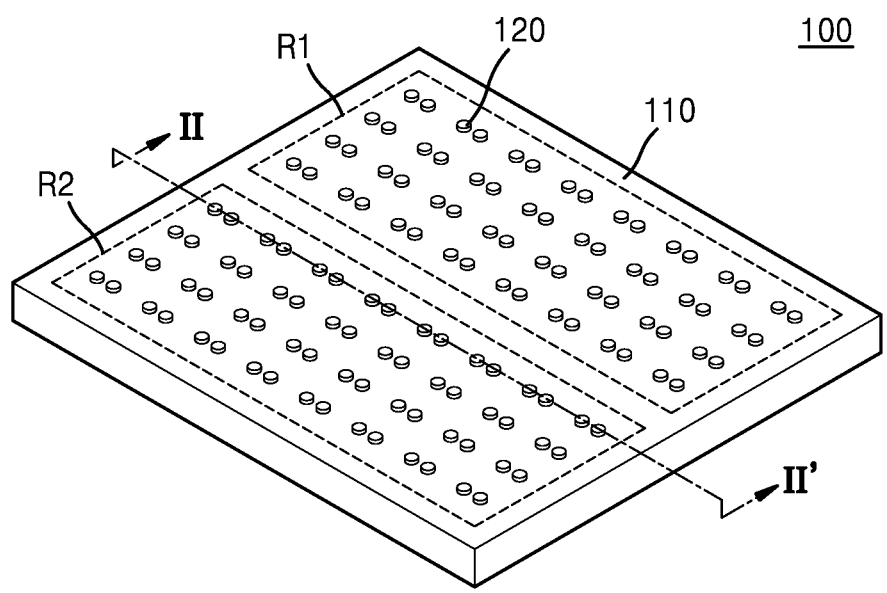
FIG. 1 is a perspective view of an interposer according to an embodiment of the inventive concept.

Hereinafter, embodiments of the inventive concept will be described in detail with reference to the accompanying drawings. Like components in the drawings will be referred to as like reference numerals, and will not be repeatedly described.

Figure 2:
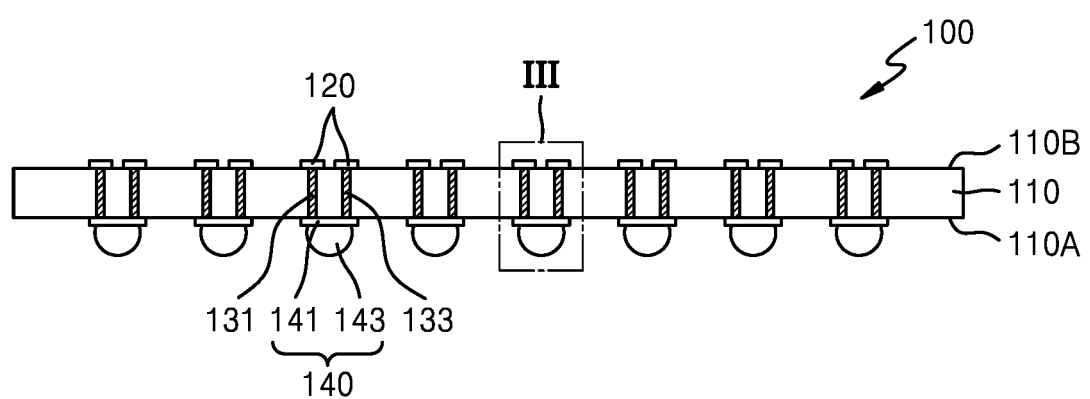
FIG. 2 is a side cross-sectional view showing a cross section along a line II-II' in the interposer of FIG. 1.

FIG. 1 is a perspective view of an interposer 100 according to an embodiment of the inventive concept. FIG. 2 is a side cross-sectional view showing a cross section along a line II-II' in the interposer 100 of FIG. 1.

Referring to FIGS. 1 and 2, the interposer 100 may include an interposer substrate 110 having a first main surface 110A and a second main surface 110B that is an opposite surface of the first main surface 110A.

The interposer substrate 110 may include a semiconductor material or an insulating material. In some embodiments of the inventive concept, the interposer substrate 110 may include silicon, germanium, silicon-germanium, gallium arsenide (GaAs), glass, ceramic, etc. The first main surface 110A and the second main surface 110B may be parallel to each other. The first main surface 110A and the second main surface 110B may be two opposing main surfaces of the interposer substrate 110.

The interposer 100 may include first and second through-electrode structures 131 and 133 passing through the interposer substrate 110. A pair of through-electrode structures, such as the first through-electrode structure 131 and the second through-electrode structure 133 may be connected to one common connection terminal structure 140. In some embodiments of the inventive concept, the first through-electrode structure 131 and the second through-electrode structure 133 may form redundancy vias, and even when a defect occurs in any one of the first through-electrode structure 131 and the second through-electrode structure 133, the other may operate, thereby preventing a defect in all of the interposer 100. The present inventive concept is not limited thereto. In some embodiment, the number of through-electrode structures connected to a common connection terminal structure 140 may be three or more.

The connection terminal structure 140 may be provided for electrical connection with an external device, e.g., a printed circuit board, and may be provided on the first main surface 110A. The connection terminal structure 140 may include a solder ball.

Each of the through-electrode structures 131 and 133 may be electrically connected with a connection pad 120 on the second main surface 110B such that another semiconductor device may be mounted on the second main surface 110B. A first region R1 on which a first semiconductor device is to be mounted and a second region R2 on which a second semiconductor device is to be mounted are indicated as virtual lines in FIG. 1. For the simplicity of drawings, the interposer 100 has two mounting regions R1 and R2 with the same area. The present inventive concept, however, is not limited thereto. In some embodiments, the interposer 100 may include three or more mounting regions. Those mounting regions may have various areas and be arranged in various manners.

Figure 3:
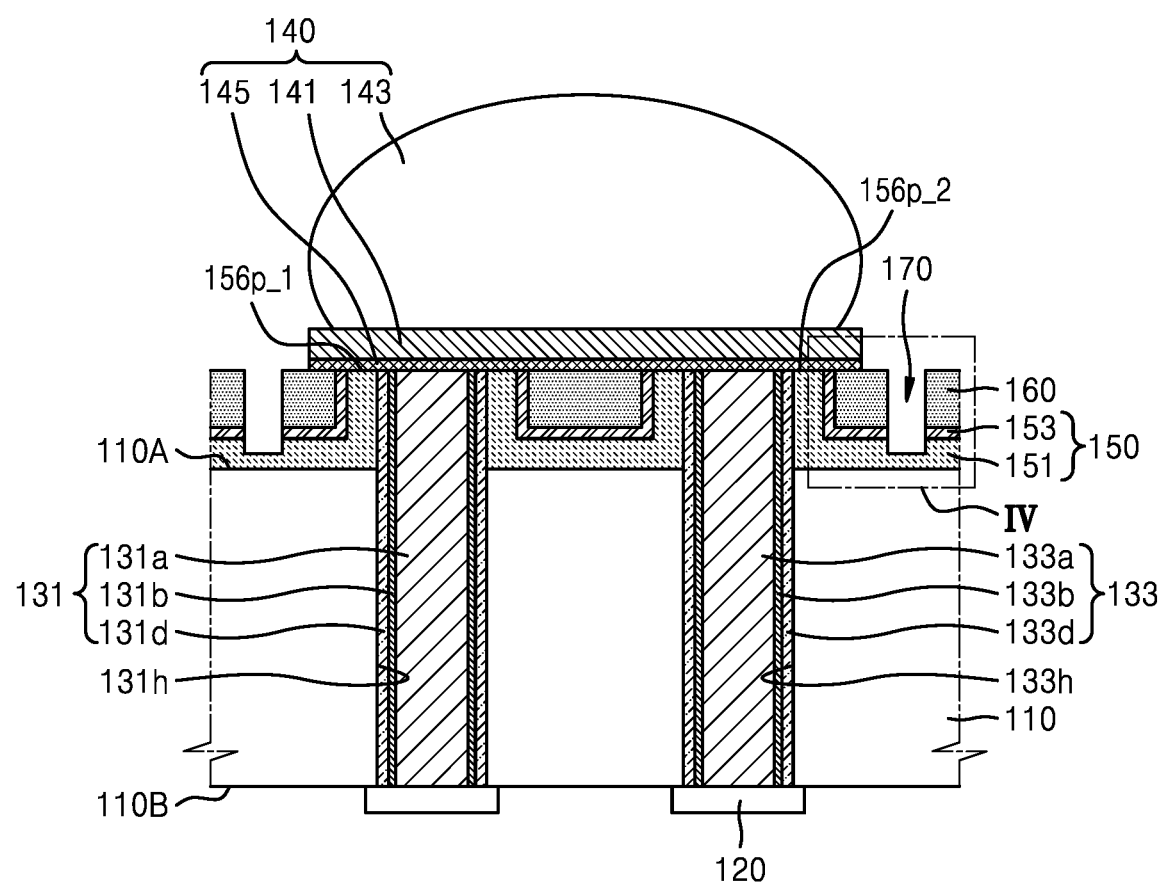
FIG. 3 is a partial enlarged view of a portion indicated by III in FIG. 2.

FIG. 3 is a partial enlarged view of a portion indicated by III in FIG. 2.

Referring to FIGS. 2 and 3, each of the first through-electrode structure 131 and the second through-electrode structure 133 may protrude from the first main surface 110A through the first main surface 110A of each interposer substrate 110. For convenience of illustration, in FIG. 2, protrusion of the first through-electrode structure 131 and the second through-electrode structure 133 from the first main surface 110A is not illustrated in detail.

The first through-electrode structure 131 may be arranged in a first via hole 131h, and may include a first core conductor 131a, a first barrier film 131b, and a first via dielectric film 131d. The second through-electrode structure 133 may be arranged in a second via hole 133h, and may include a second core conductor 133a, a second barrier film 133b, and a second via dielectric film 133d.

Each of the first core conductor 131a and the second core conductor 133a may include one or more selected from, for example, aluminum (Al), gold (Au), beryllium (Be), bismuth (Bi), cobalt (Co), copper (Cu), hafnium (Hf), indium (In), magnesium (Mg), manganese (Mn), molybdenum (Mo), nickel (Ni), lead (Pb), palladium (Pd), white gold (Pt), rhodium (Rh), rhenium (Re), ruthenium (Ru), tin (Sn), tantalum (Ta), tellurium (Te), titanium (Ti), tungsten (W), zinc (Zn), and zirconium (Zr).

The first barrier film 131b and the second barrier film 133b may contact sidewalls of the first core conductor 131a and the second core conductor 133a, and surround the first core conductor 131a and the second core conductor 133a in a side direction. For example, the first barrier film 131b and the second barrier film 133b may contact sidewalls of the first core conductor 131a and the second core conductor 133a respectively, and surround the sidewalls of the first core conductor 131a and the second core conductor 133a respectively. In some embodiment, the first barrier film 131b and the first core conductor 131a may be concentric in a top down view. In some embodiment, the second barrier film 133b and the second core conductor 133a may be concentric in the top down view. The first barrier film 131b and the second barrier film 133b may be conductor films having a relatively low wiring resistance. For example, the first barrier film 131b and the second barrier film 133b each may be a single film or a multi-layered film including at least one selected from among W, WN, WC, Ti, TiN, Ta, TaN, Ru, Co, Mn, WN, Ni, or NiB. For example, the first barrier film 131b and the second barrier film 133b each may be a multi-layered film including TaN/W, TiN/W, or WN/W. In some embodiments of the inventive concept, each of the first barrier film 131b and the second barrier film 133b may have a thickness between about 50 Å and about 1000 Å. Terms such as "about" or "approximately" may reflect amounts, sizes, orientations, or layouts that vary, due to a process variation, only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. The term "contact," as used herein, refers to a direct connection (i.e., touching) unless the context indicates otherwise.

In some embodiments of the inventive concept, the first barrier film 131b and the second barrier film 133b may have an approximately constant thickness in a longitudinal direction of the first through-electrode structure 131 and in a longitudinal direction of the second through-electrode structure 133, respectively. In some embodiments of the inventive concept, the first barrier film 131b and the second barrier film 133b may be formed by chemical vapor deposition (CVD), physical vapor deposition (PVD), or atomic layer deposition (ALD).

The first via dielectric film 131d and the second via dielectric film 133d electrically insulate the first core conductor 131a and the second core conductor 133a from the interposer substrate 110. The first via dielectric film 131d and the second via dielectric film 133d may include an oxide film, a nitride film, a carbide film, a polymer, or a combination thereof. In some embodiments of the inventive concept, the first via dielectric film 131d and the second via dielectric film 133d may be formed by CVD. In some embodiments of the inventive concept, each of the first via dielectric film 131d and the second via dielectric film 133d may have a thickness between about 500 Å and about 2500 Å.

The first through-electrode structure 131 and the second through-electrode structure 133 may extend by a certain distance beyond the first main surface 110A. The first through-electrode structure 131 and the second through-electrode structure 133 may protrude by a predetermined distance between several µm and several tens of µm, e.g., between about 3 µm and about 20 µm, beyond the first main surface 110A.

A passivation layer 150 may cover the first main surface 110A. The passivation layer 150 may surround protruding portions of the first through-electrode structure 131 and the second through-electrode structure 133, which protrude beyond the first main surface 110A, in a side direction. For example, the passivation layer 150 may surround sidewalls of the protruding portions of the first through-electrode structure 131 and the second through-electrode structure 133.

The passivation layer 150 may include a first passivation layer (i.e., a lower passivation layer) 151 and a second passivation layer (i.e., an upper passivation layer) 153. Each of the first passivation layer 151 and the second passivation layer 153 may be formed of an insulating film, for example, a silicon oxide film, a silicon nitride film, or a silicon oxynitride film. In some embodiments, the first passivation layer 151 and the second passivation layer 153 may be formed of different kinds of insulating films or have the same kind of an insulating film. In some embodiments of the inventive concept, the first passivation layer 151 may be a silicon oxide film, and the second passivation layer 153 may be a silicon nitride film or a silicon oxynitride film. In some embodiments, the first passivation layer 151 may be a tetraethyl orthosilicate (TEOS) film, a high density plasma (HDP) oxide film, a boro-phospho-silicate glass (BPSG) oxide film, or a flowable chemical vapor deposition (FCVD) oxide film, and the second passivation layer 153 may be a silicon nitride or a silicon oxynitride.

The first passivation layer 151 may have a thickness between about 1.0 µm and about 3.0 µm, between about 1.2 µm and about 2.5 µm, between about 1.4 µm and about 2.2 µm, between about 1.5 µm and about 2.1 µm, or between about 1.6 µm and about 2.0 µm. The first passivation layer 151 may also have a Young's modulus between about 60 GPa and about 80 GPa, between about 65 GPa and about 75 GPa, or between about 68 GPa and about 72 GPa.

The second passivation layer 153 may have a thickness between about 0.35 µm and about 0.75 µm, between about 0.40 µm and about 0.70 µm, between about 0.45 µm and about 0.65 µm, between about 0.48 µm and about 0.62 µm, or between about 0.50 µm and about 0.60 µm. The second passivation layer 153 may also have a Young's modulus between about 100 GPa and about 160 GPa, between about 120 GPa and about 140 GPa, or between about 125 GPa and about 135 GPa.

The first passivation layer 151 may be formed to contact the first main surface 110A. The first passivation layer 151 may cover a sidewall of the first through-electrode structure 131 and may be in contact with the sidewall. For example, the first passivation layer 151 may cover a sidewall of the protruding portion of the first through-electrode structure 131 and may be in contact with the sidewall of the protruding portion. The second passivation layer 153 may extend horizontally along the first main surface 110A, with the first passivation layer 151 between the second passivation layer 153 and the first main surface 110A. The second passivation layer 153 may extend vertically along the protruding portion of the first through-electrode structure 131, with the first passivation layer 151 between the second passivation layer 153 and the protruding portion of the first through-electrode structure 131. For the brevity of description, the first passivation layer 151 is described above with reference to the first through-electrode structure 131. The same description of the first passivation layer 151 may apply to the second through-electrode structure 133.

Top ends of the first passivation layer 151 and the second passivation layer 153, which surround the sidewall of the first through-electrode structure 131, may form a first top surface 156p_1. Top ends of the first passivation layer 151 and the second passivation layer 153, which surround a sidewall of the second through-electrode structure 133, may form a second top surface 156p_2. In some embodiments of the inventive concept, a top surface of the first through-electrode structure 131 may be substantially coplanar with the first top surface 156p_1. In some embodiments of the inventive concept, a top surface of the second through-electrode structure 133 may be substantially coplanar with the second top surface 156p_2.

A photosensitive polymer layer 160 may be provided on the passivation layer 150. The photosensitive polymer layer 160 may include a material to which a photolithography process is applicable, for example, a photoimageable dielectric (PID) material. The PID material may include, for example, a polyimide-based photosensitive polymer, a novolac-based photosensitive polymer, polybenzoxazole, silicone-based polymer, acrylate-based polymer, or epoxy-based polymer.

The photosensitive polymer layer 160 may fill a space between the two passivation layers 151 and 153 that respectively surround, in a side direction, the first through-electrode structure 131 and the second through-electrode structure 133 that protrude from and extend upward from the first main surface 110A. For example, the photosensitive polymer layer 160 may be arranged between the passivation layer surrounding the first through-electrode structure 131 in the side direction and the passivation layer surrounding the second through-electrode structure 133 in the side direction.

In some embodiments of the inventive concept, a top surface of the photosensitive polymer layer 160 may be arranged substantially coplanar with top surfaces of the first through-electrode structure 131 and the second through-electrode structure 133. In some embodiments of the inventive concept, a top surface of the photosensitive polymer layer 160 may be arranged substantially coplanar with top surfaces of the first top surface 156_1 and the second top surface 156_2.

The connection terminal structure 140 may be electrically connected to and in contact with the first through-electrode structure 131 and the second through-electrode structure 133. The connection terminal structure 140 may include a seed metal layer 145 that contacts both the first through-electrode structure 131 and the second through-electrode structure 133, a first conductor layer 141 formed on the seed metal layer 145, and a solder metal layer 143 provided on the first conductor layer 141. In some embodiments, the solder metal layer 143 may be referred to as a solder ball.

The seed metal layer 145 may include, for example, titanium (Ti), copper (Cu), chromium (Cr), tungsten (W), nickel (Ni), aluminum (Al), palladium (Pd), gold (Au), or an alloy thereof. The seed metal layer 145 may be formed by, for example, PVD such as sputtering. The seed metal layer 145 may have a thickness between about 1 μm and about 20 μm, between about 3 μm and about 15 μm, or between about 4 μm and about 10 μm.

The first conductor layer 141 formed on the seed metal layer 145 may be, but not limited to, metals such as copper (Cu), tungsten (W), titanium (Ti), titanium tungsten (TiW), titanium nitride (TiN), tantalum (Ta), tantalum nitride (TaN), chromium (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc., alloys thereof, or metal nitrides. The first conductor layer 141 may have a thickness between about 10 μm and about 100 μm, between about 15 μm and about 80 μm, or between about 20 μm and about 60 μm.

A solder metal layer 143 may be provided on the first conductor layer 141. The solder metal layer 143 may be an alloy including silver (Ag), copper (Cu), palladium (Pd), aluminum (Al), and silicon (Si) with tin (Sn) as a main component. Herein, the 'main component' may refer to a component of which a weight percentage exceeds 50% of a total weight of the alloy.

A bottom surface of the seed metal layer 145 may contact the top surface of the photosensitive polymer layer 160. For example, the seed metal layer 145 may contact a portion of the photosensitive polymer layer 160 between the first through-electrode structure 131 and the second through-electrode structure 133 that contact the seed metal layer 145. For example, the bottom surface of the seed metal layer 145 may be substantially coplanar with a top surface of the portion of the photosensitive polymer layer 160 arranged under the seed metal layer 145.

In some embodiments of the inventive concept, an alignment key 170 may be further provided adjacent to the first through-electrode structure 131. The alignment key 170 may have a shape of a recess passing through the photosensitive polymer layer 160. In some embodiments of the inventive concept, the alignment key 170 may have a shape of a groove that passes through the photosensitive polymer layer 160 and extends by a certain length in a direction parallel to the first main surface 110A.

In some embodiments of the inventive concept, the alignment key 170 may pass through the photosensitive polymer layer 160 and at least partially pass through the passivation layer 150. In some embodiments of the inventive concept, the alignment key 170 may completely pass through the passivation layer 150 such that the first main surface 110A is exposed.

Figure 4:
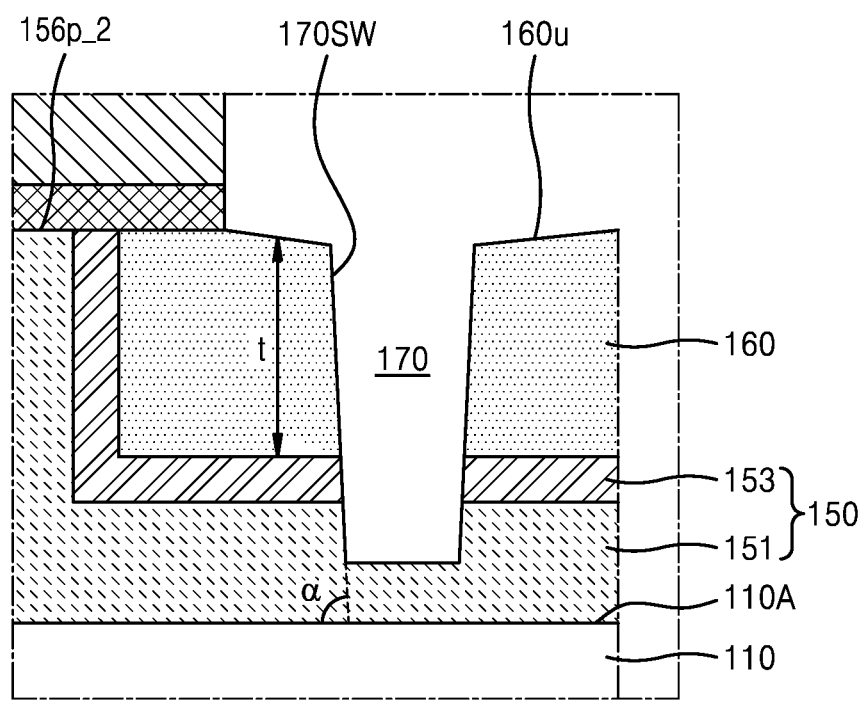
FIG. 4 is a partial detailed view of a portion indicated by IV in FIG. 3.

FIG. 4 is a partial detailed view of a portion indicated by IV in FIG. 3.

Referring to FIG. 4, a sidewall 170SW of the alignment key 170 may be inclined at an acute angle with respect to the first main surface 110A. An angle α of the sidewall 170SW with respect to the first main surface 110A may be an angle between about 80 degrees and about 88 degrees or between about 83 degrees and about 87 degrees. In some embodiments of the inventive concept, the sidewall 170SW may be formed by anisotropic etching as will be described below. Since a traveling direction of some ions or plasma used in anisotropic etching may have a distribution around a perpendicular direction with respect to the first main surface 110A, the inclination of the sidewall 170SW may not be a completely right angle with respect to the first main surface 110A.

In some embodiments, the sidewall 170SW may partially have a curved surface. For example, the sidewall 170SW may be largely a plane in a portion corresponding to the photosensitive polymer layer 160, but may be a different plane or a curved surface in a portion corresponding to the passivation layer 150. In this case, the angle may be defined as an angle between an extending line of the portion corresponding to the photosensitive polymer layer 160 and the first main surface 110A.

A top surface 160u of the photosensitive polymer layer 160 may not be completely parallel with the first main surface 110A. In some embodiments of the inventive concept, a vertical thickness t of the photosensitive polymer layer 160 between the connection terminal structure 140 and the alignment key 170 may decrease in a direction toward the alignment key 170. For example, the photosensitive polymer layer 160 may have a decreasing thickness toward the alignment key 170 with a thickness change between about 0.01 μm and about 0.5 μm.

Referring back to FIG. 3, connection pads 120 may be provided in end portions of the first through-electrode structure 131 and the second through-electrode structure 133 near the second main surface 110B. The connection pad 120 may include aluminum (Al), copper (Cu), gold (Au), silver (Ag), platinum (Pt), palladium (Pd), nickel (Ni), cobalt (Co), tungsten (W), zinc (Zn), or an alloy thereof.

Although the planar shape of the connection pad 120 is illustrated as a circle in FIG. 1, the planar shape of the connection pad 120 may be, but not limited to, an arbitrary polygon such as a square, a rectangle, etc., an oval, etc.

Figure 5:
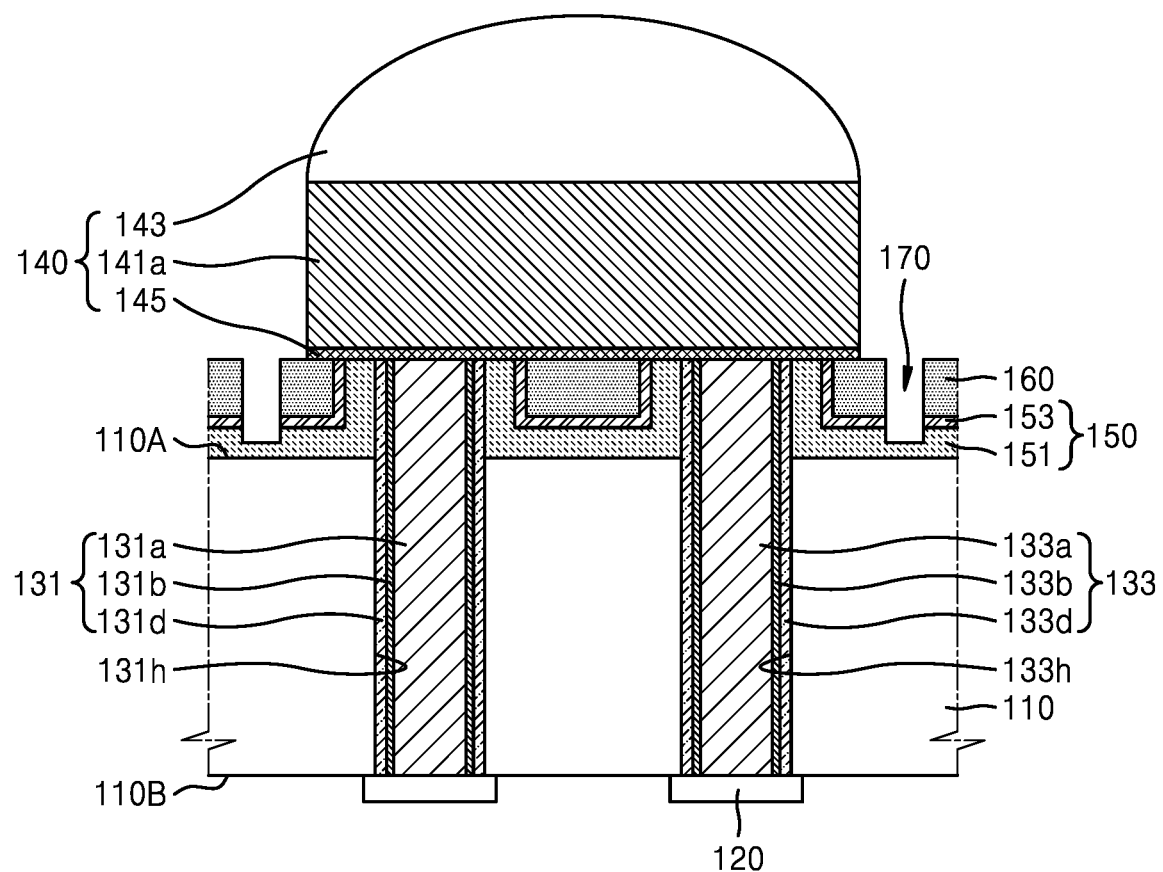
FIG. 5 is a partial enlarged view of a portion indicated by III in FIG. 2 of an interposer according to another embodiment of the inventive concept.
Figure 6:
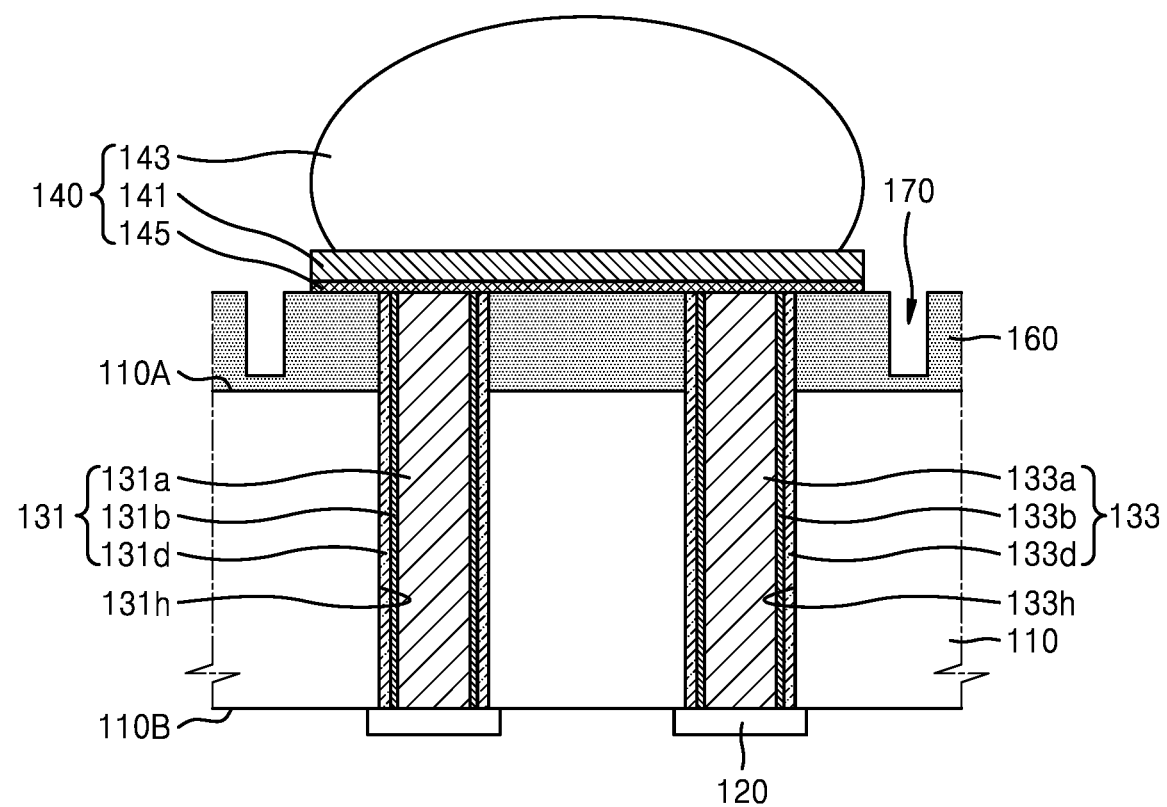
FIG. 6 is a partial enlarged view of a portion indicated by III in FIG. 2 of an interposer according to another embodiment of the inventive concept.

FIGS. 5 and 6 are partial enlarged views of a portion indicated by III in FIG. 2 of an interposer according to other embodiments of the inventive concept.

An embodiment of FIG. 5 is the same as the embodiment of FIG. 3 except that a first conductor layer 141*a* is of a pillar type. Thus, hereinbelow, the embodiment of FIG. 5 will be described based on such a difference.

Referring to FIG. 5, vertical dimensions of the first conductor layer 141*a* of the pillar type may be greater than those of the first conductor layer 141 shown in FIG. 3. The first conductor layer 141*a* may include, for example, copper (Cu), aluminum (Al), gold (Au), silver (Ag), platinum (Pt), palladium (Pd), nickel (Ni), cobalt (Co), tungsten (W), zinc (Zn), or an alloy thereof, and especially, copper (Cu).

An embodiment of FIG. 6 is the same as the embodiment of FIG. 3 except that the passivation layer 150 is omitted. Thus, hereinbelow, the embodiment of FIG. 6 will be described based on such a difference.

Referring to FIG. 6, the passivation layer 150 is omitted, such that the photosensitive polymer layer 160 may contact the first main surface 110A of the interposer substrate 110. The photosensitive polymer layer 160 may contact the sidewalls of the first through-electrode structure 131 and the second through-electrode structure 133 that protrude from the first main surface 110A. For example, the photosensitive polymer layer 160 may contact the sidewall of the protruding portion of each of the first through-electrode structure 131 and the second through-electrode structure 133.

The alignment key 170 may be formed in the photosensitive polymer layer 160. The alignment key 170 may be adjacent to the first through-electrode structure 131 and/or the second through-electrode structure 133. The alignment key 170 may not pass through the photosensitive polymer layer 160. In some embodiments of the inventive concept, the alignment key 170 may pass through the photosensitive polymer layer 160, and a portion of the first main surface 110A may be exposed by the alignment key 170.

In some embodiments of the inventive concept, the top surface of the first through-electrode structure 131 may be substantially coplanar with the top surface of the photosensitive polymer layer 160. The top surface of the second through-electrode structure 133 may be substantially coplanar with the top surface of the photosensitive polymer layer 160.

Figure 7:
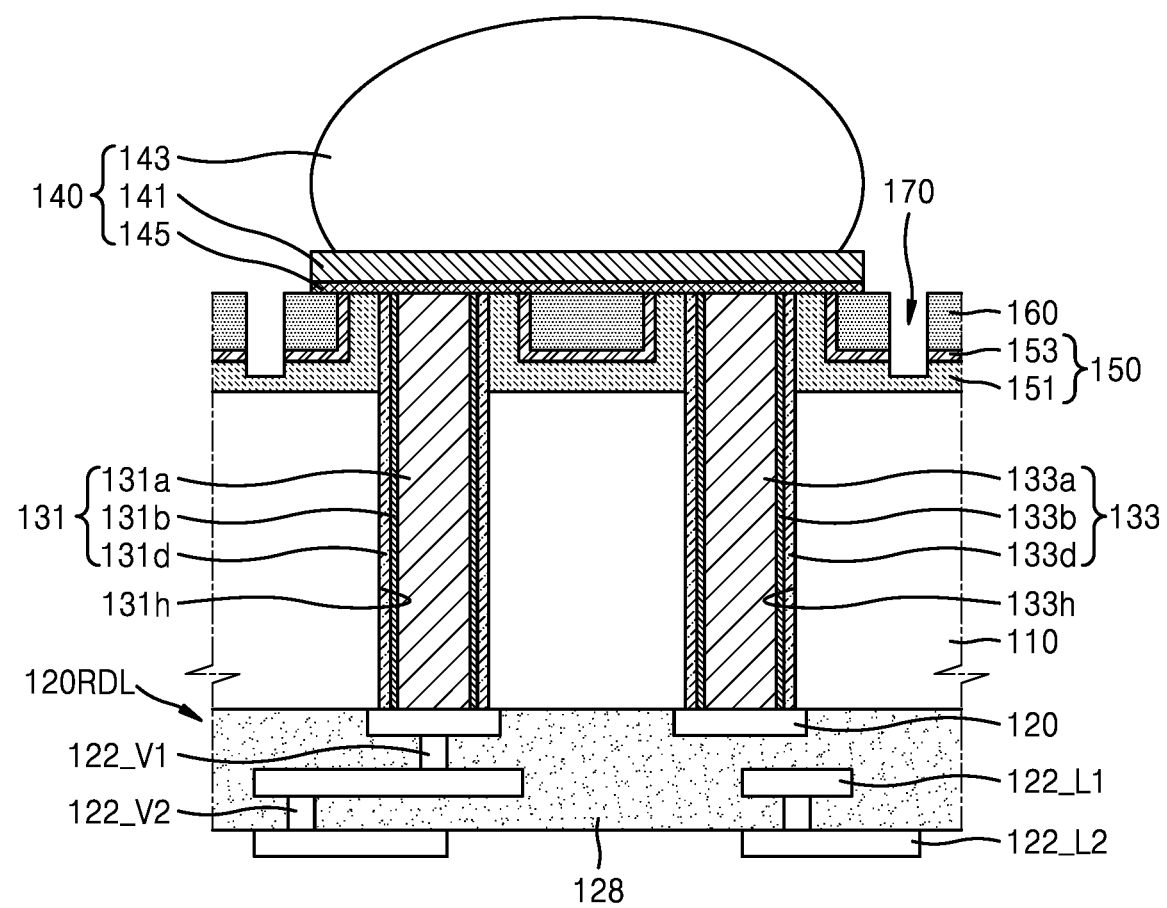
FIG. 7 is a partial enlarged view of a portion indicated by III in FIG. 2 of an interposer according to another embodiment of the inventive concept.

FIG. 7 is a partial enlarged view of a portion indicated by III in FIG. 2 of an interposer according to another embodiment of the inventive concept.

An embodiment of FIG. 7 is the same as the embodiment of FIG. 3 except that a redistribution layer 120RDL is further provided. Thus, hereinbelow, the embodiment of FIG. 7 will be described based on such a difference.

Referring to FIG. 7, the redistribution layer 120RDL may be further provided on the connection pad 120. The redistribution layer 120RDL may include contact plugs 122_V1 and 122_V2 and metal horizontal wires 122_L1 and 122_L2. The contact plugs 122_V1 and 122_V2 may electrically connect the metal horizontal wires 122_L1 and 122_L2 to each other, which are formed in multi-levels, and/or the connection pad 120 at each level. The redistribution layer 120RDL may further include an interlayer insulating film 128 to electrically insulate several components. The interlayer insulating film 128 may include silicon oxide, silicon nitride, silicon oxynitride, polymer, or a combination thereof.

Figure 8:
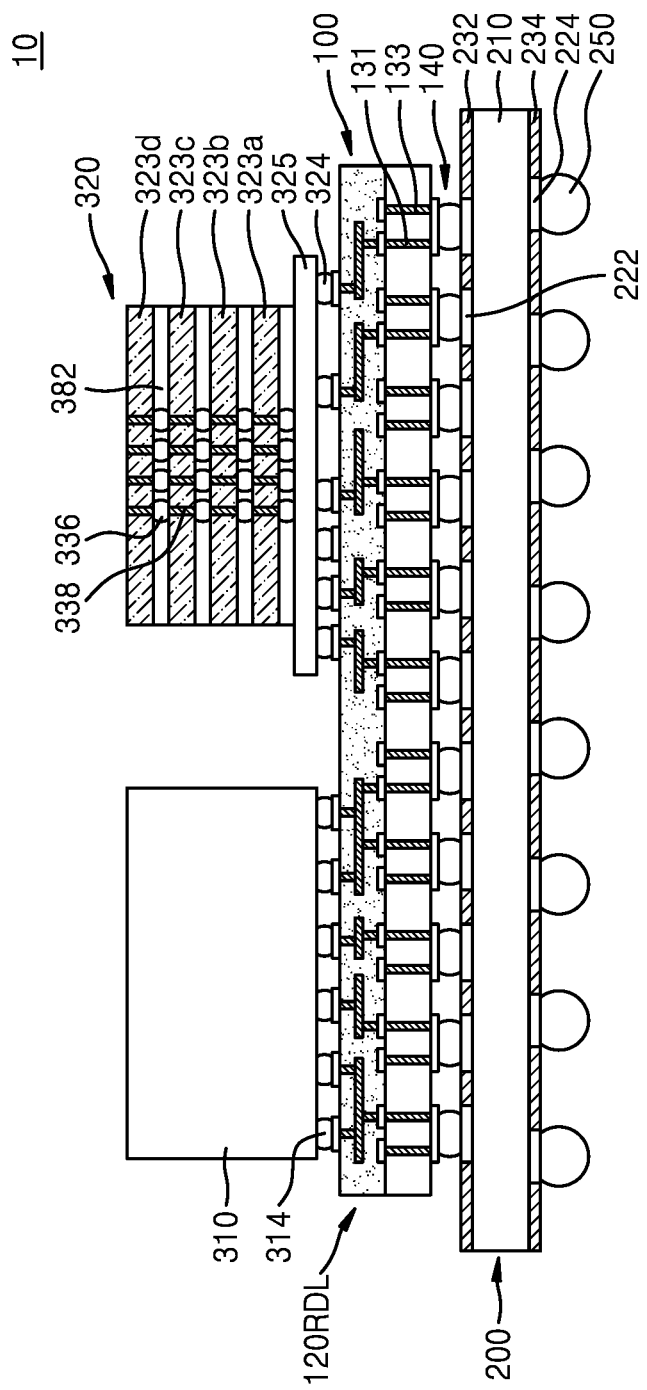
FIG. 8 is a side cross-sectional view of a semiconductor package including an interposer, according to an embodiment of the inventive concept.

FIG. 8 is a side cross-sectional view of a semiconductor package 10 including the interposer 100, according to an embodiment of the inventive concept.

Referring to FIG. 8, the semiconductor package 10 may include a package substrate 200, the interposer 100 arranged on the package substrate 200, and a first semiconductor device 310 and a second semiconductor device 320 that are mounted on the interposer 100.

The package substrate 200 may include a base board layer 210, and a top pad 222 and a bottom pad 224 which are arranged on a top surface and a bottom surface of the base board layer 210, respectively.

In some embodiments of the inventive concept, the package substrate 200 may be a printed circuit board (PCB). For example, the package substrate 200 may be a multi-layered PCB. The base board layer 210 may include at least one material selected from phenol resin, epoxy resin, and polyimide. The base board layer 210 may include at least one material selected from, for example, flame retardant 4, tetrafunctional epoxy, polyphenylene ether, epoxy/polyphenylene oxide, bismaleimide triazine (BT), Thermount, cyanate ester, polyimide, and liquid crystal polymer.

On the top surface and the bottom surface of the base board layer 210 may be a top solder resist layer 232 and a bottom solder resist layer 234 that expose the top pad 222 and the bottom pad 224, respectively. The connection terminal structure 140 may be connected to the top pad 222, and an external connection terminal 250 may be connected to the bottom pad 224.

The package substrate 200 may include interconnection patterns that electrically connect the top pad 222 with the bottom pad 224 and conductive vias that electrically connect the interconnection patterns to each other. The interconnection patterns may be located on the top surface, the bottom surface, and/or the inside of the base board layer 210. The interconnection patterns may include, for example, an electrolytically deposited (ED) copper foil, a rolled-annealed (RA) copper foil, a stainless-steel foil, an aluminum foil, ultra-thin copper foils, sputtered copper, copper alloys, etc.

The conductive vias may be formed to pass through at least a part of the base board layer 210. In some embodiments of the inventive concept, the conductive vias may include copper, nickel, stainless steel, or beryllium copper.

In some embodiments of the inventive concept, when the semiconductor package 10 does not include the package substrate 200, the connection terminal structure 140 may function as an external connection terminal.

The interposer 100 has been described in detail with reference to FIGS. 1 through 7, and thus will not be described in detail at this time.

The first semiconductor device 310 may be mounted on a first region R1 (see FIG. 1) on the interposer 100. The first semiconductor device 310 may be connected to the redistribution layer 120RDL of the interposer 100 through a connection member 314. The connection member 314 may include, for example, a bump, a solder ball, or a conductive pillar.

The first semiconductor device 310 may be, for example, a central processing unit (CPU), a graphic processing unit (GPU), or an application processor (AP). In some embodiments of the inventive concept, the first semiconductor device 310 may further include, for example, a dynamic random access memory (DRAM), a static random access memory (SRAM), a flash memory, an electrically erasable and programmable read-only memory (EEPROM), a phase-change random access memory (PRAM), a magnetic random access memory (MRAM), or a resistive random access memory (RRAM). As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips.

The second semiconductor device 320 may be mounted on a second region R2 (see FIG. 2) on the interposer 100.

The second semiconductor device 320 may be, for example, a high bandwidth memory (HBM) DRAM. The second semiconductor device 320 may include a semiconductor chip or a stack of a plurality of memory semiconductor chips. Herein, the 'stack' may be defined as any memory chips included together in one assembly based on definitions of the Joint Electron Device Engineering Council (JEDEC).

The second semiconductor device 320 may include a plurality of memory chips 323a, 323b, 323c, and 323d. The plurality of memory chips 323a, 323b, 323c, and 323d may be electrically connected with one another by connection terminals 336. The connection terminals 336 may be bumps or solder balls.

Each of the plurality of memory chips 323a, 323b, 323c, and 323d may include a through silicon via (TSV) 338 that electrically connects a chip pad arranged on an inactive surface with a chip pad arranged on an active surface.

The plurality of memory chips 323a, 323b, 323c, and 323d may be attached to one another by adhesive layers 382. In some embodiments of the inventive concept, the adhesive layer 382 may include a non-conductive film (NCF).

The second semiconductor device 320 may further include a logic chip 325. The plurality of memory chips 323a, 323b, 323c, and 323d may be stacked on the logic chip 325 that may be mounted on the interposer 100.

The logic chip 325 may serve to control the operation of the plurality of memory chips 323a, 323b, 323c, and 323d. The logic chip 325 may be a semiconductor chip and may be described as a control chip. In some embodiments, the logic chip 325 may include, but is not limited to, for example, logic circuits such as a serializer (SER)/deserializer (DES) circuits. The logic chip 325 may be connected to the redistribution layer 120RDL of the interposer 100 through a connection member 324. The connection member 324 may include, for example, a bump, a solder ball, or a conductive pillar.

In some embodiments of the inventive concept, the interposer 100, the first semiconductor device 310, and the second semiconductor device 320 may be sealed by an encapsulant, but the encapsulant is not shown for identification of other components in FIG. 8.

The semiconductor package 10 may further include a heat dissipation member such as a heat slug or a heat sink. The heat dissipation member may be configured to contact the first semiconductor device 310, the second semiconductor device 320, and/or the encapsulant.

Figure 9:
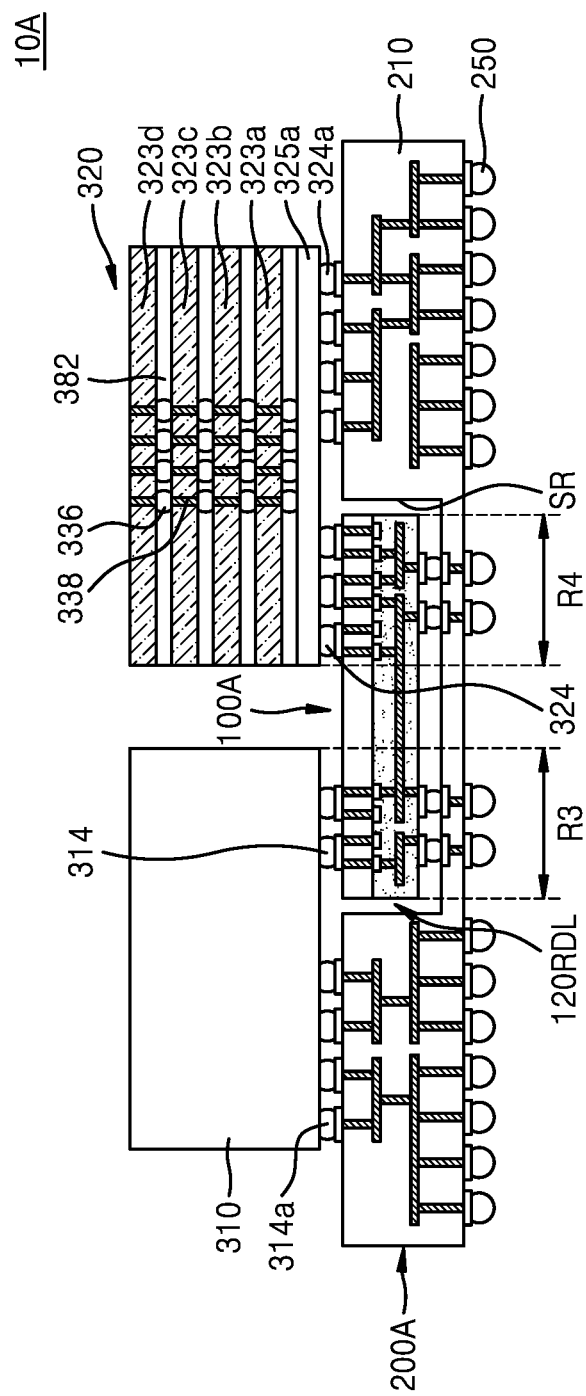
FIG. 9 is a side cross-sectional view of a semiconductor package including an interposer, according to another embodiment of the inventive concept.

FIG. 9 is a side cross-sectional view of a semiconductor package 10A including an interposer 100A, according to an embodiment of the inventive concept.

Referring to FIG. 9, the semiconductor package 10A may include a package substrate 200A having a recess portion SR, the interposer 100A which is accommodated in the recess portion SR and electrically connected with the package substrate 200A, and the first semiconductor device 310 and the second semiconductor device 320 which are mounted on both the interposer 100A and the package substrate 200A. In some embodiments, the first semiconductor device 310 may partially overlap the interposer 100A, and the second semiconductor device 320 may partially overlap the interposer 100A.

The package substrate 200A may include the recess portion SR. A depth of the recess portion SR may be determined based on a level that a top surface of the interposer 100A needs to have when the interposer 100A is accommodated in the recess portion SR. In some embodiments of the inventive concept, the top surface of the package substrate 200A may be arranged substantially coplanar with the top surface of the interposer 100A accommodated in the recess portion SR.

The interposer 100A may include a third region R3 that partially overlaps the first semiconductor device 310 and a fourth region R4 that partially overlaps the second semiconductor device 320. In some embodiments of the inventive concept, the interposer 100A may completely overlap any one of the first semiconductor device 310 and the second semiconductor device 320 and partially overlap the other.

The first semiconductor device 310 and the second semiconductor device 320 may be electrically connected with the interposer 100A through the connection members 314 and 324. The first semiconductor device 310 and the second semiconductor device 320 may be electrically connected with the package substrate 200A through connection members 314a and 324a.

While the redistribution layer 120RDL is aligned to face the package substrate 200A in FIG. 9, the redistribution layer 120RDL may be aligned to face the first semiconductor device 310 and the second semiconductor device 320 in another embodiment of the inventive concept.

The first semiconductor device 310 and the second semiconductor device 320 have been described in detail with reference to FIG. 8, and thus will not be described repeatedly.

Figure 10:
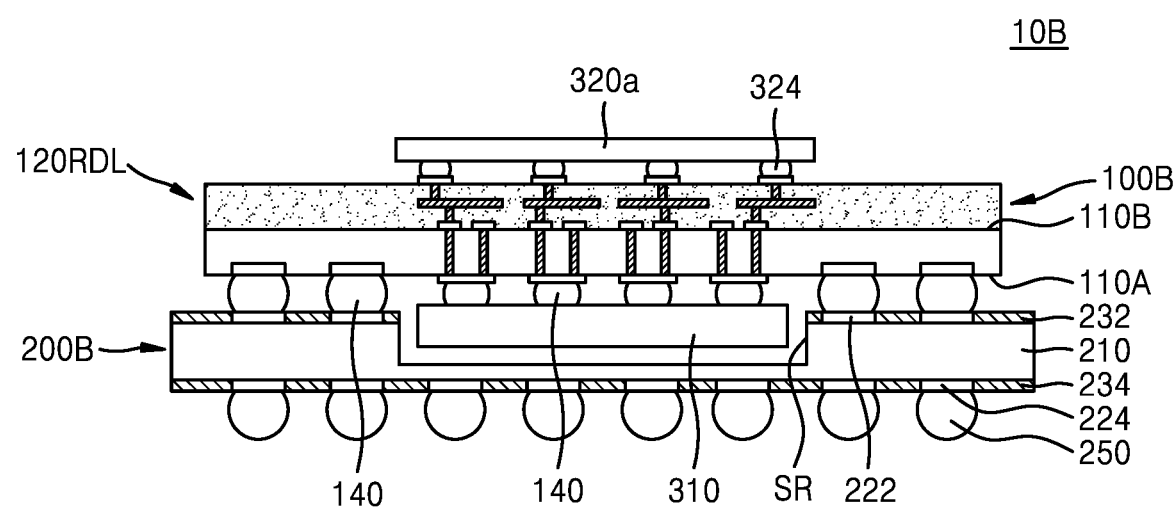
FIG. 10 is a side cross-sectional view of a semiconductor package including an interposer, according to another embodiment of the inventive concept.

FIG. 10 is a side cross-sectional view of a semiconductor package 10B including an interposer 100B, according to another embodiment of the inventive concept.

Referring to FIG. 10, the semiconductor package 10B may include an interposer 100B, the first semiconductor device 310 and a second semiconductor device 320a mounted on different surfaces of the interposer 100B, and a package substrate 200B on which the interposer 100B is mounted.

The first semiconductor device 310 may be mounted on a first main surface 110A of the interposer 100B, and the second semiconductor device 320a may be mounted on a second main surface 110B of the interposer 100B, more specifically, on the redistribution layer 120RDL. While the first semiconductor device 310 and the second semiconductor device 320a are illustrated as a single semiconductor chip in FIG. 10, each of the first semiconductor device 310 and the second semiconductor device 320a may include a plurality of semiconductor chips.

The interposer 100B may be mounted on the package substrate 200B by the connection terminal structure 140. The first semiconductor device 310 may also be mounted on the interposer 100B by the connection terminal structure 140. The second semiconductor device 320a may be electrically connected with the redistribution layer 120RDL through the connection member 324.

The package substrate 200B may include the recess portion SR that at least partially accommodates the first semiconductor device 310.

Figure 11A:
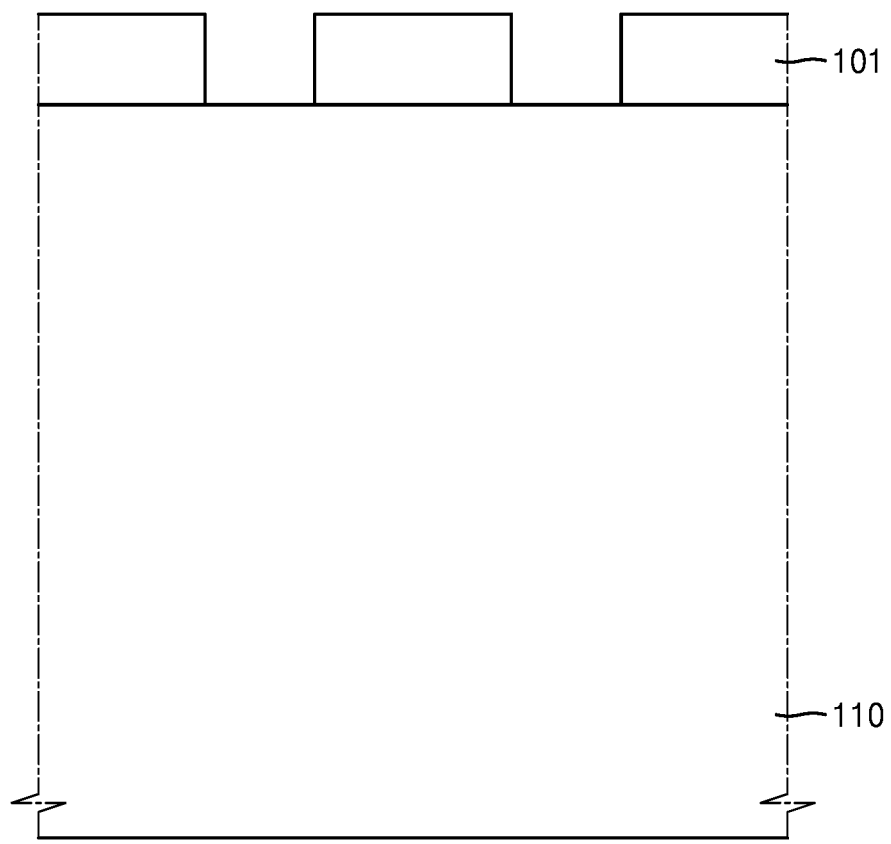
FIGS. 11A through 11R are side cross-sectional views illustrating a method of fabricating an interposer, according to an embodiment of the inventive concept.
Figure 11B:
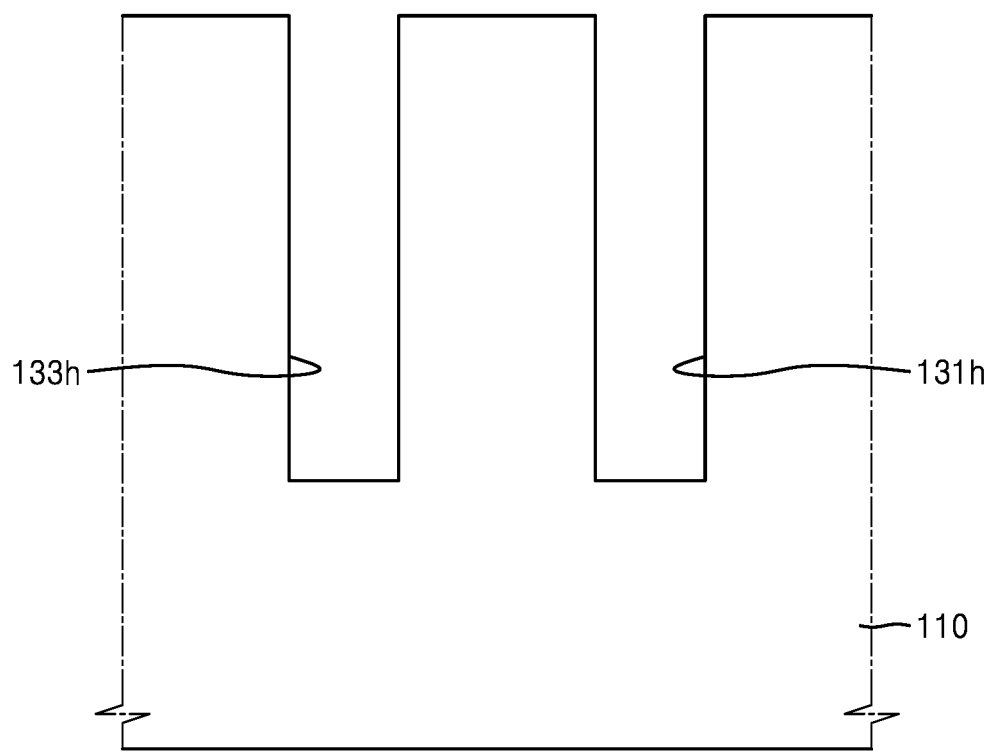
Figure 11C:
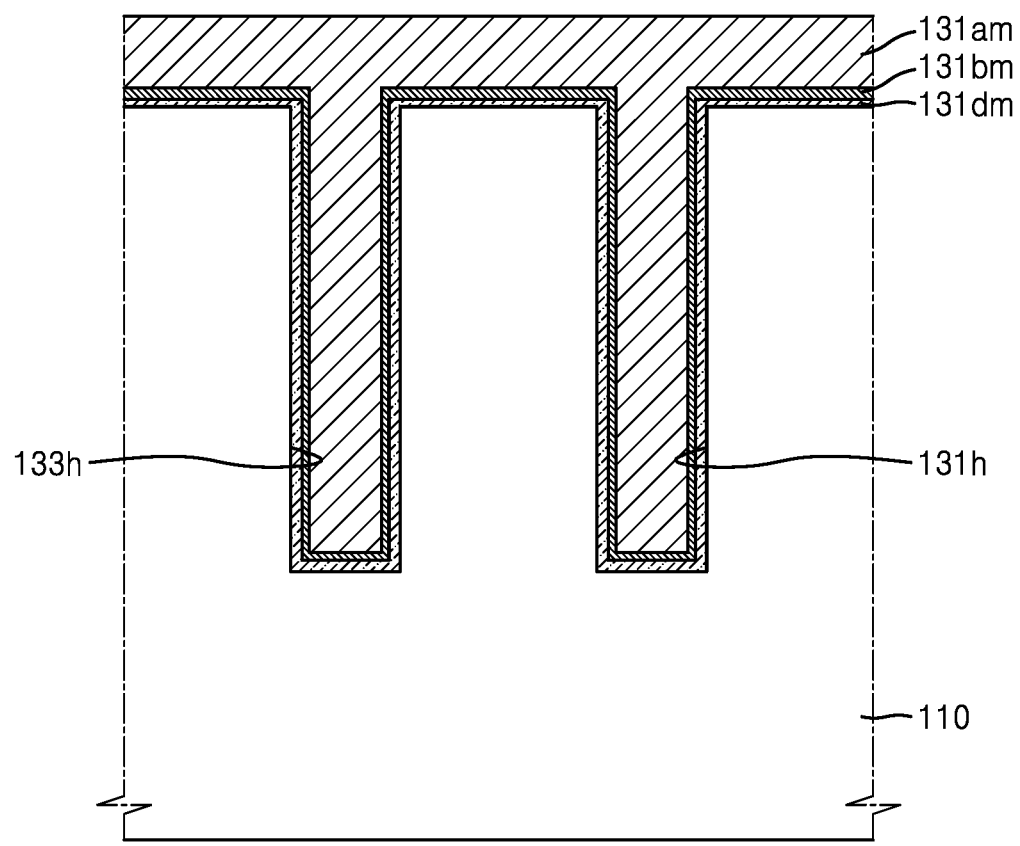
Figure 11D:
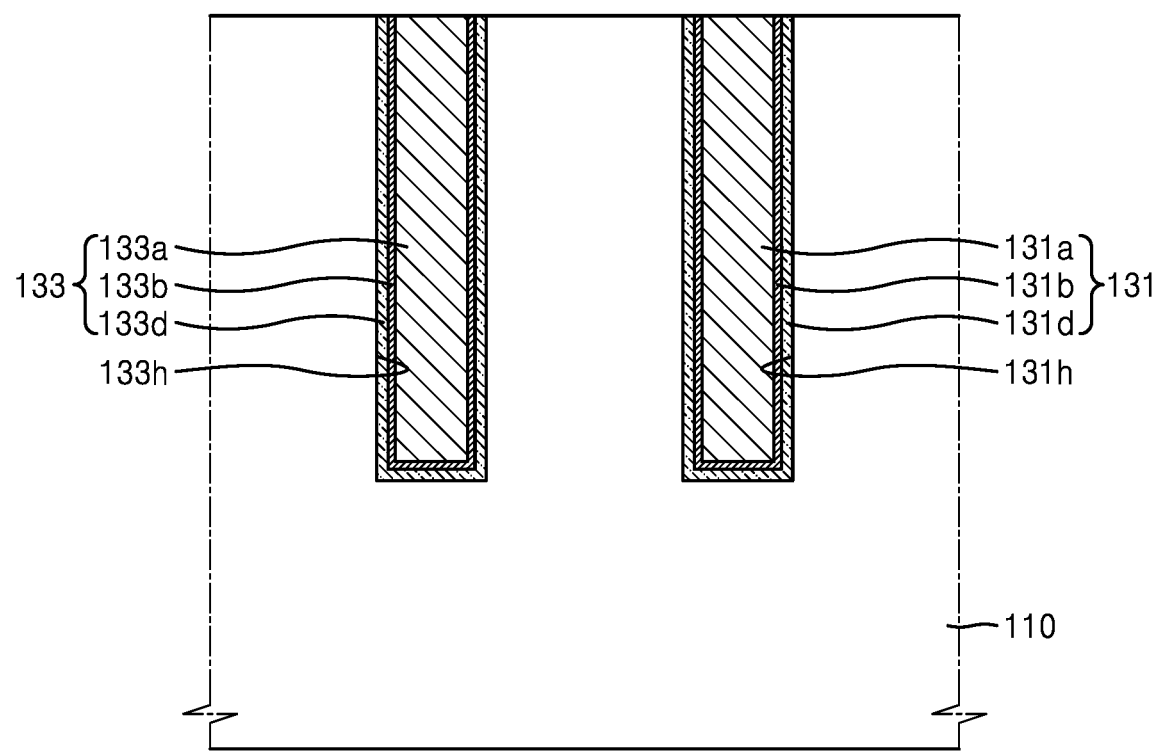
Figure 11E:
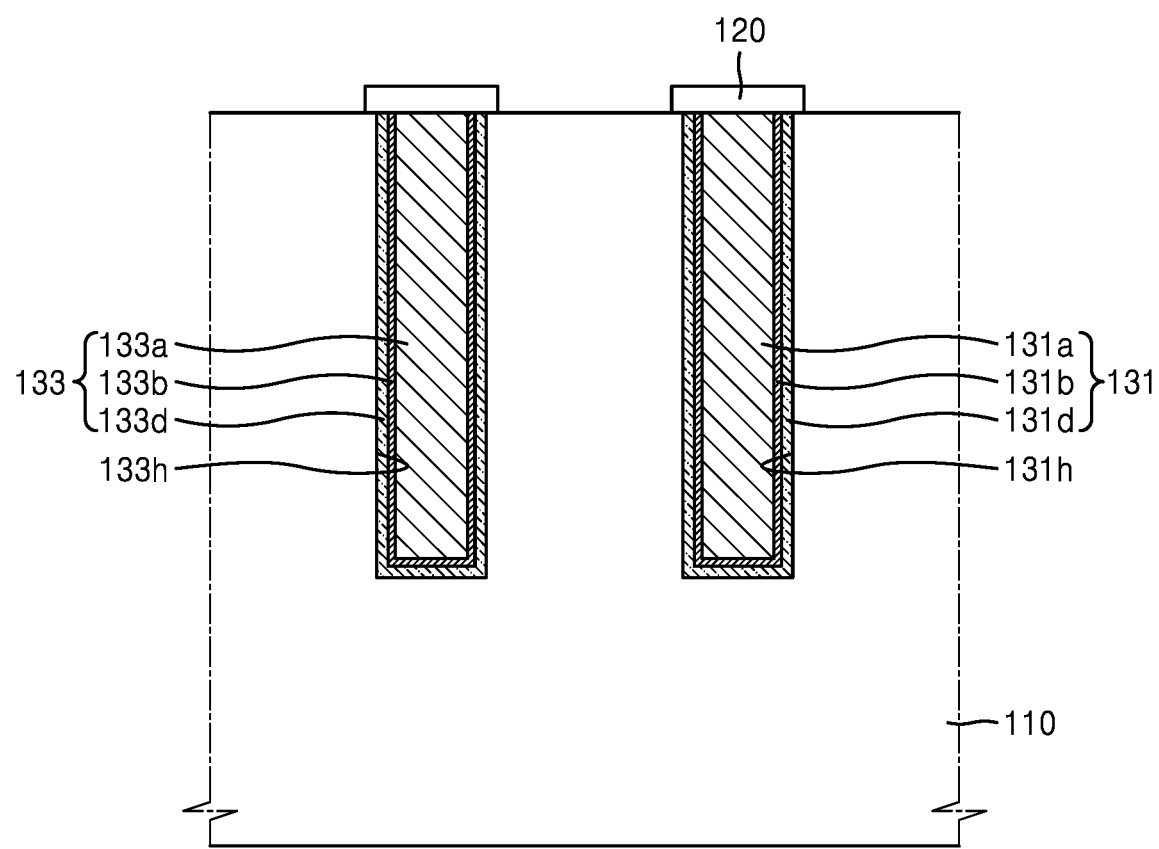
Figure 11F:
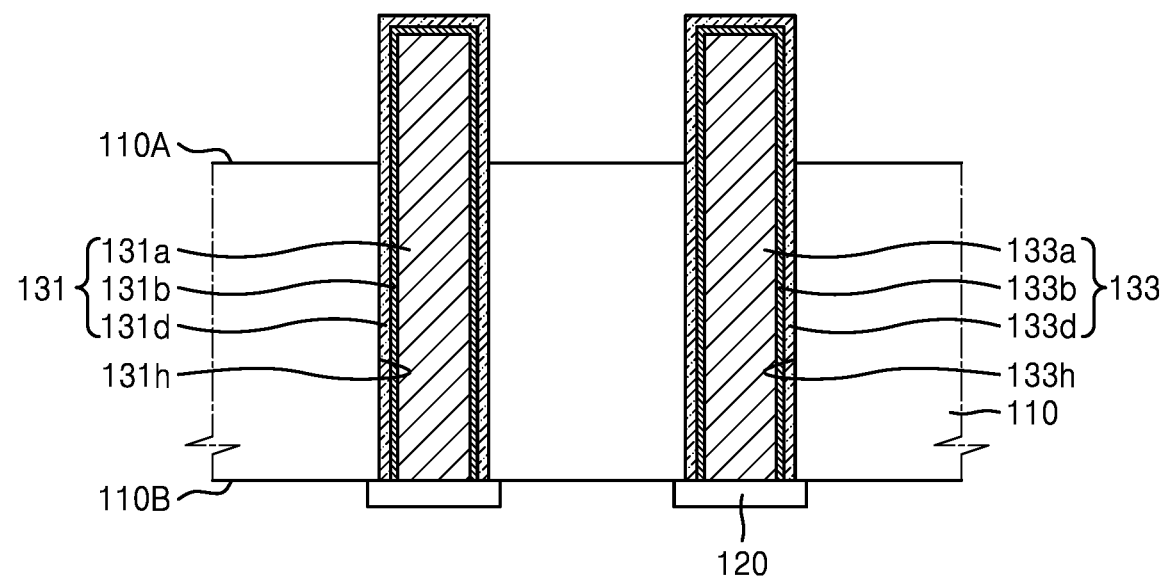
Figure 11G:
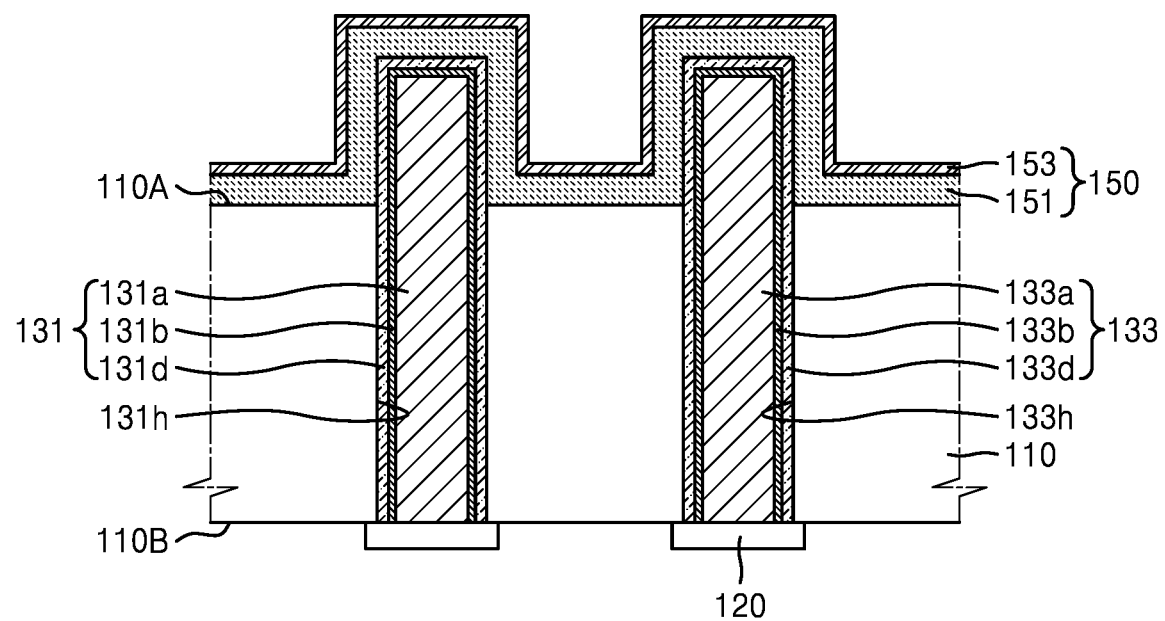
Figure 11H:
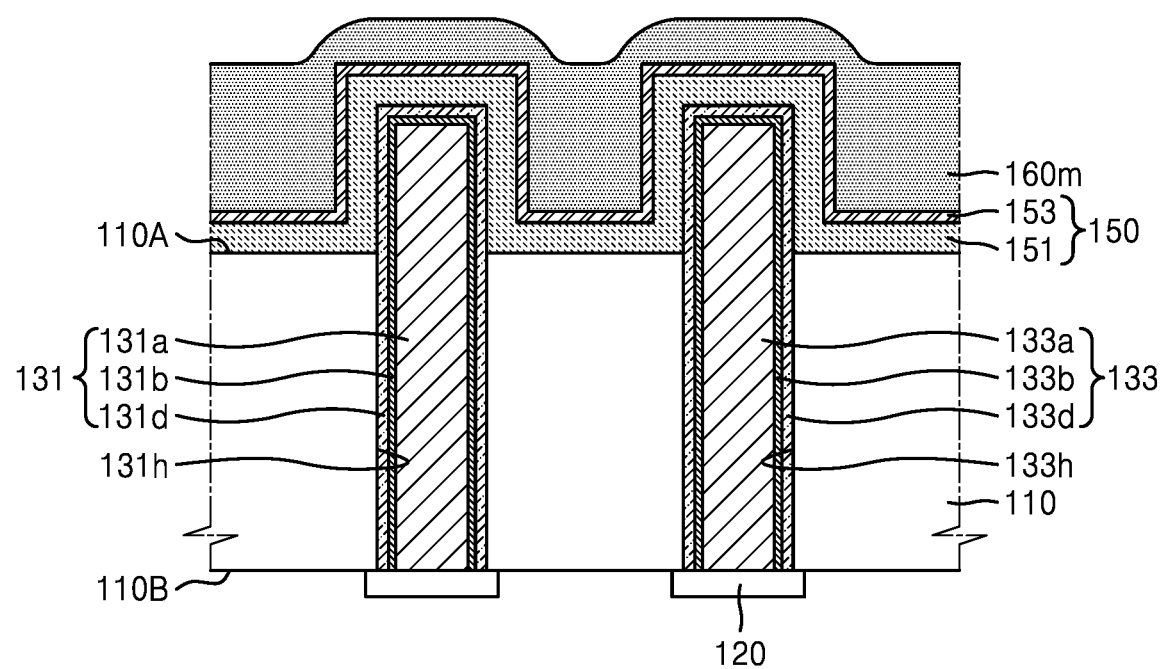
Figure 11I:
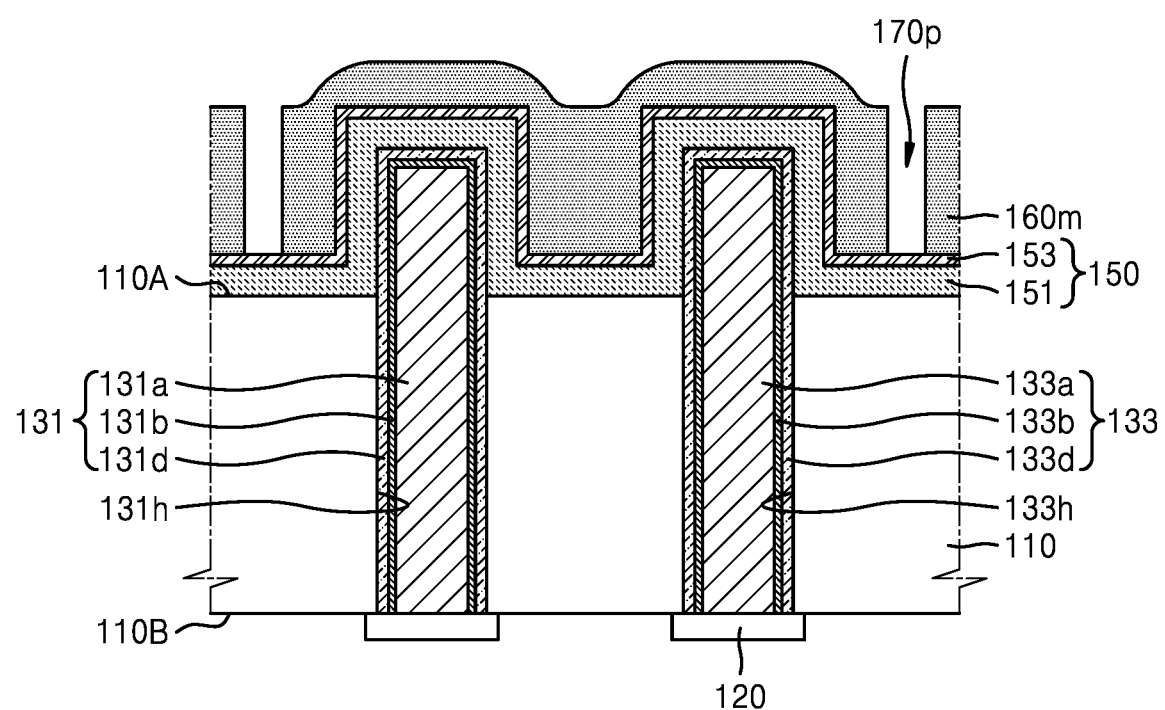
Figure 11J:
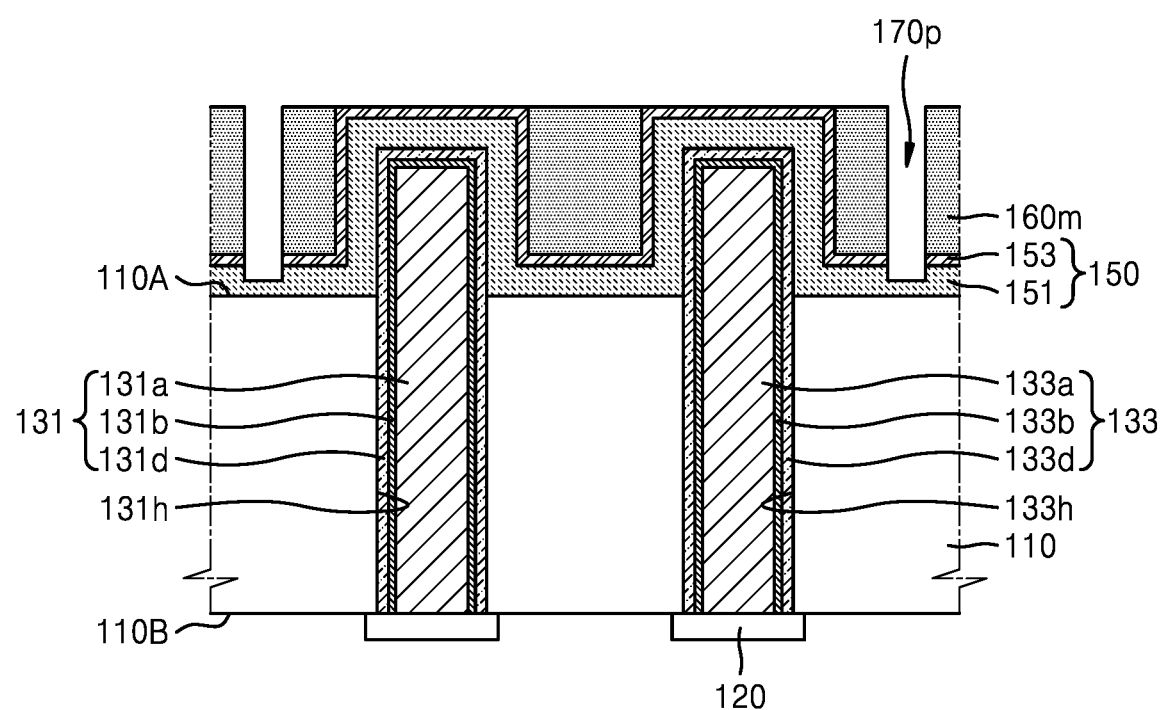
Figure 11K:
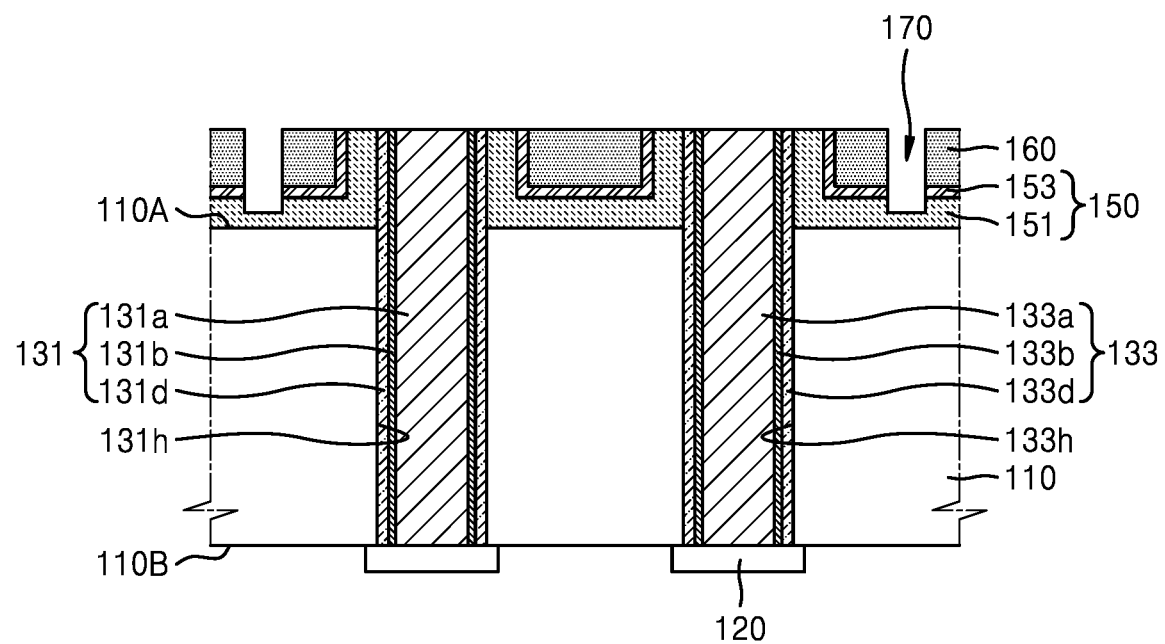
Figure 11L:
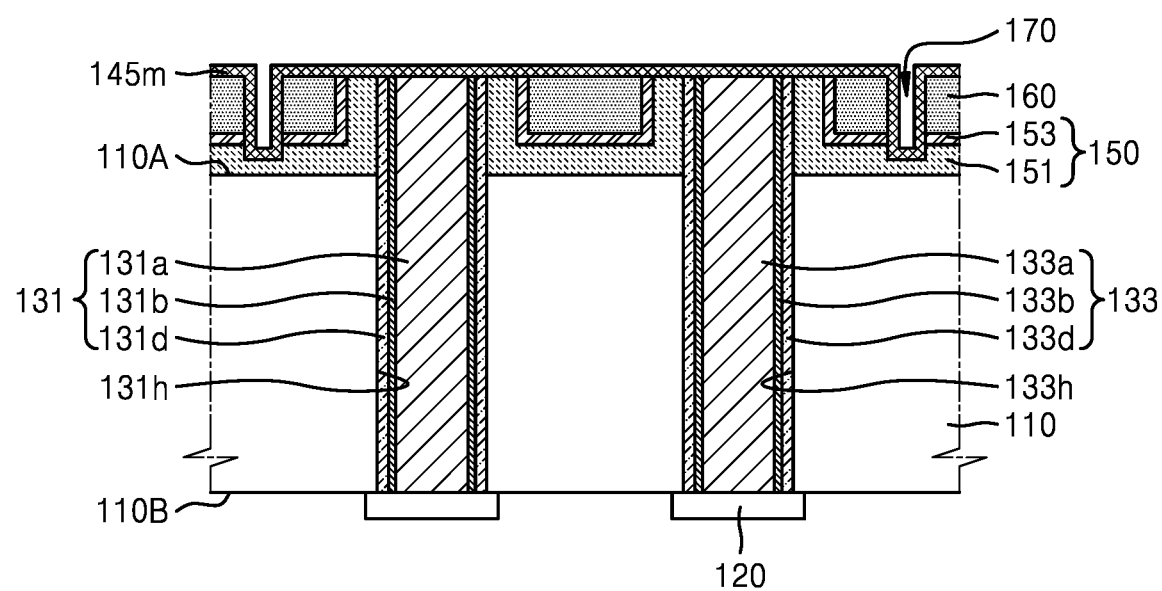
Figure 11M:
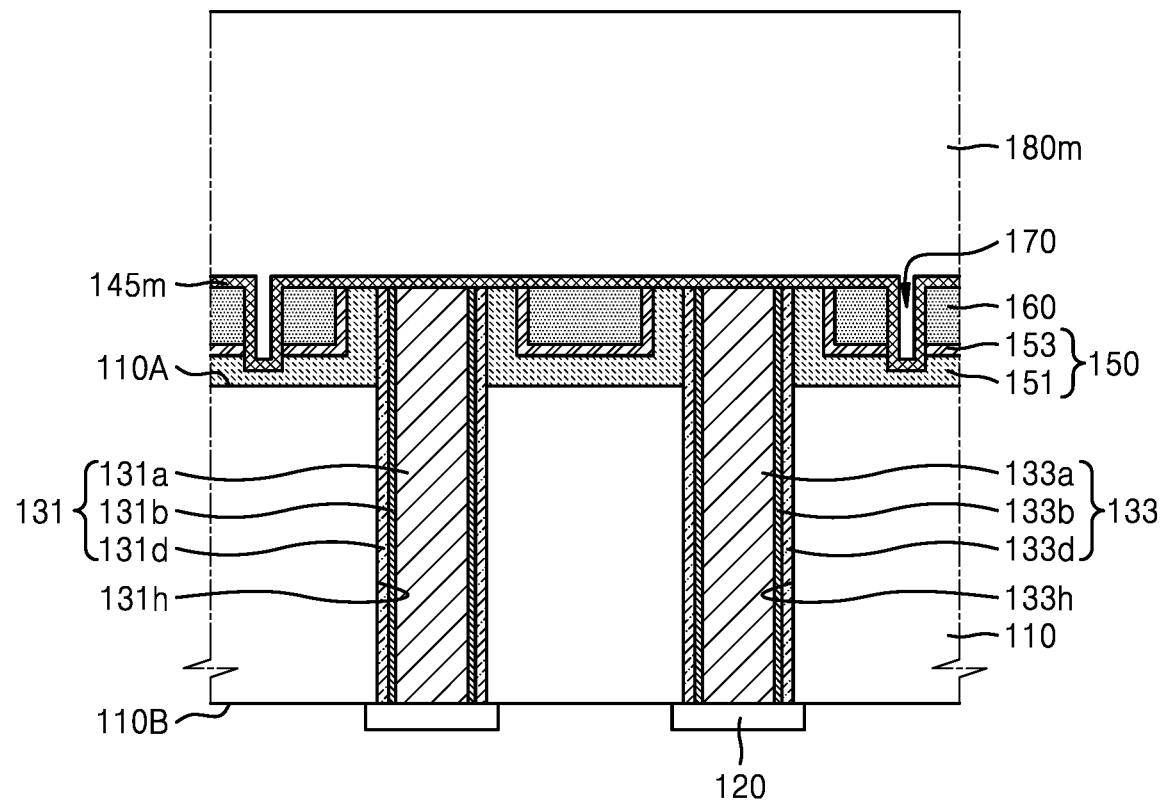
Figure 11N:
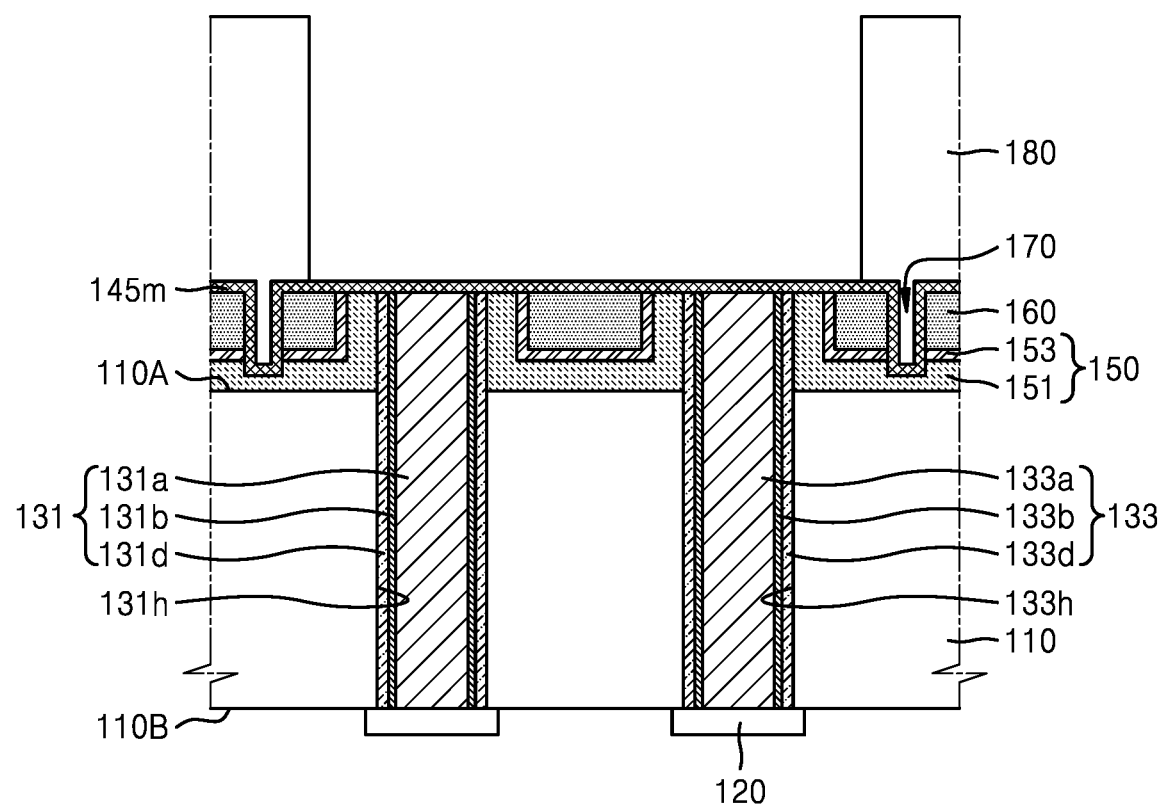
Figure 11O:
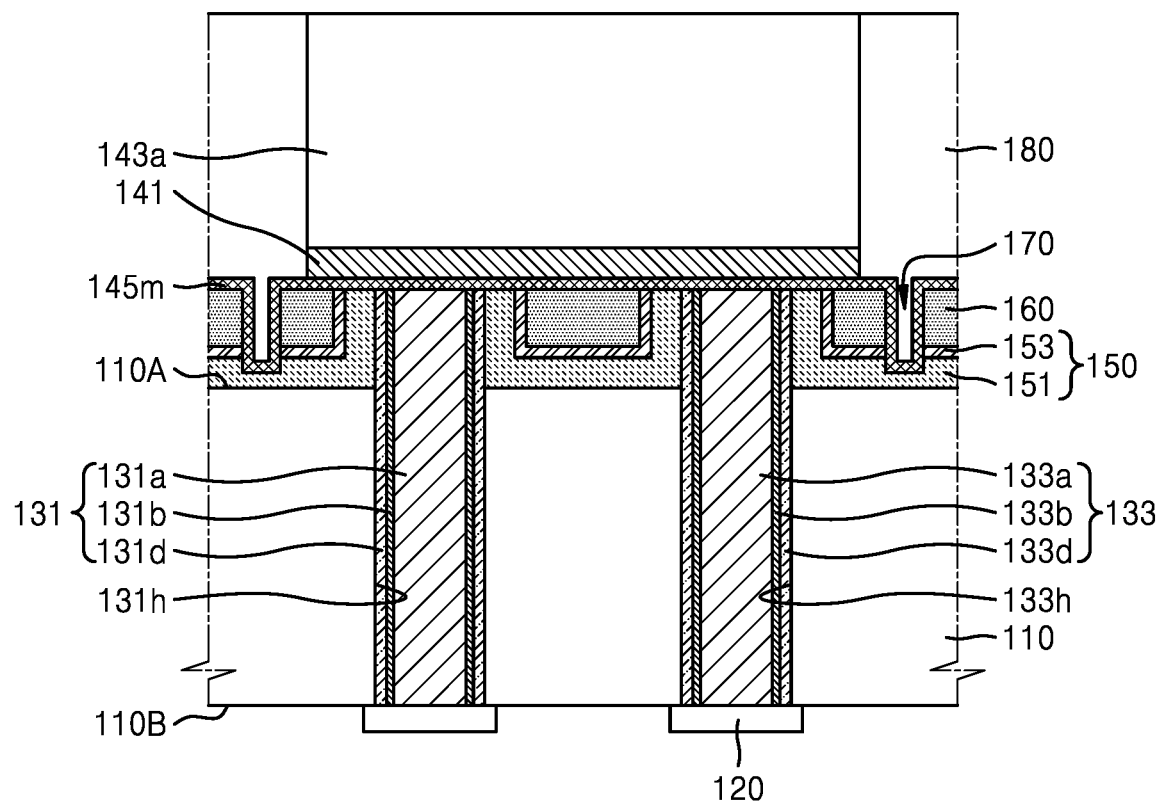
Figure 11P:
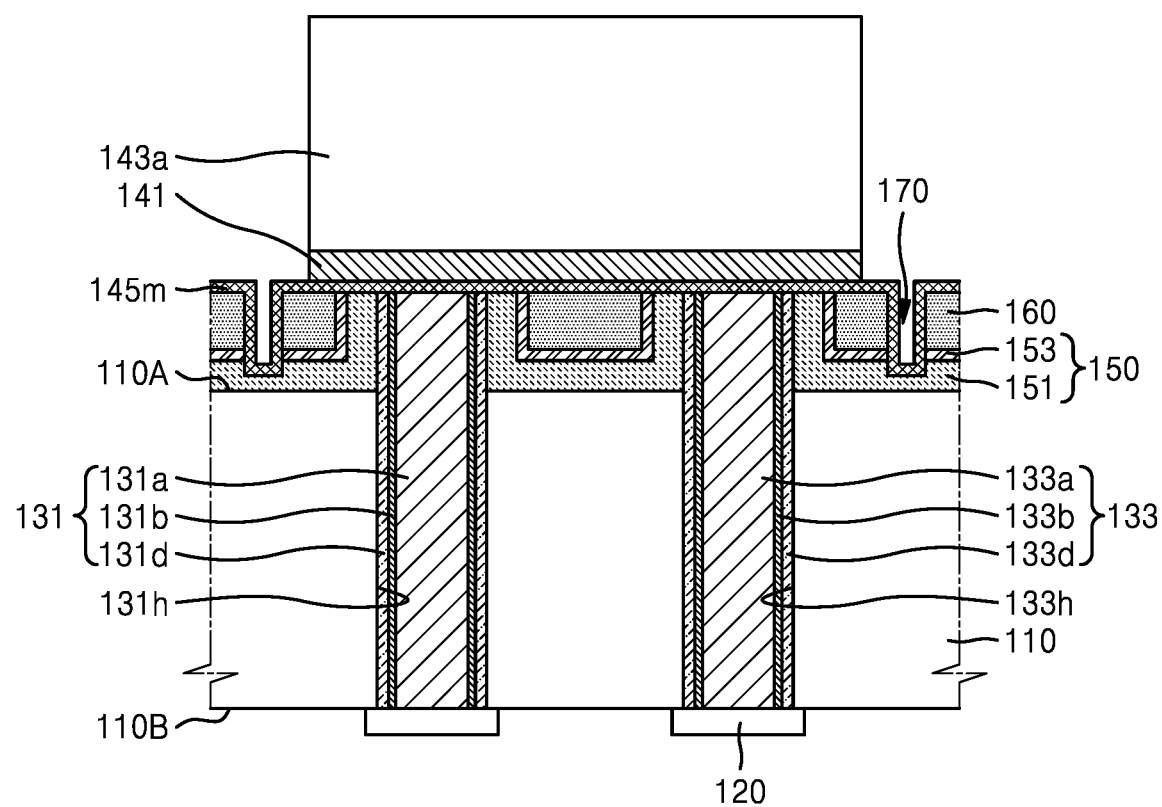
Figure 11Q:
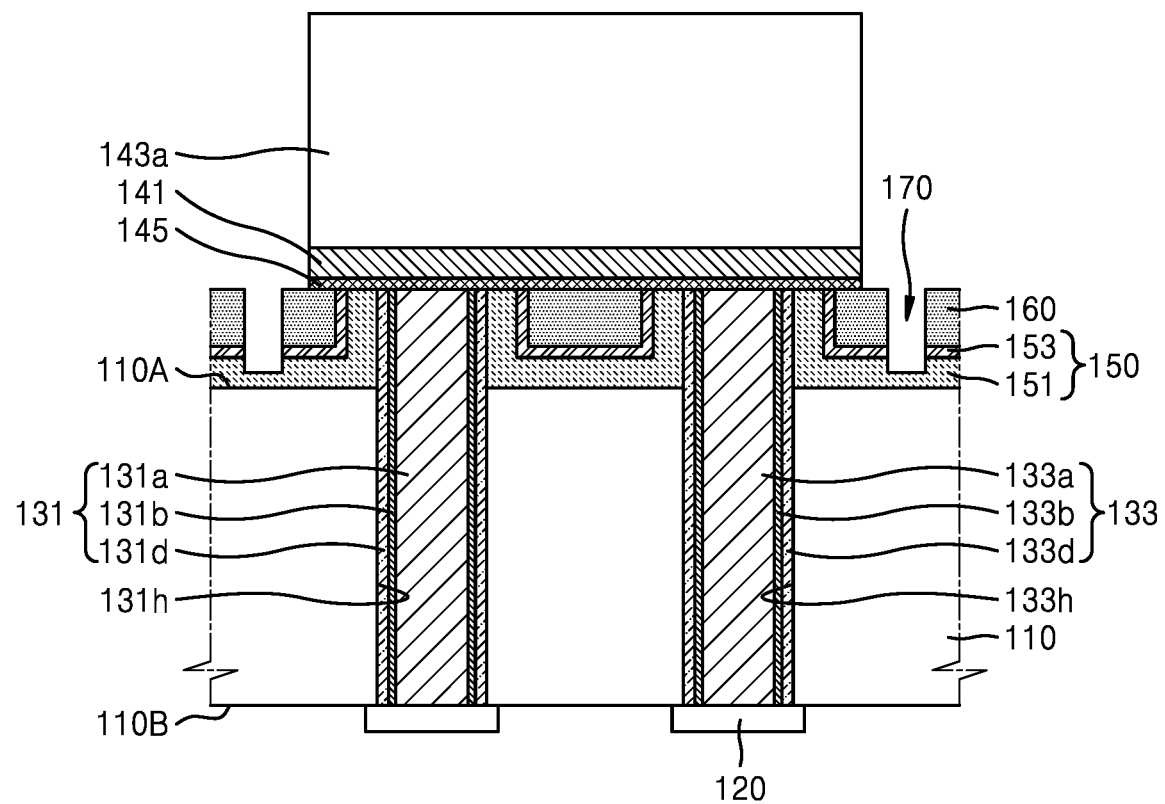
Figure 11R:
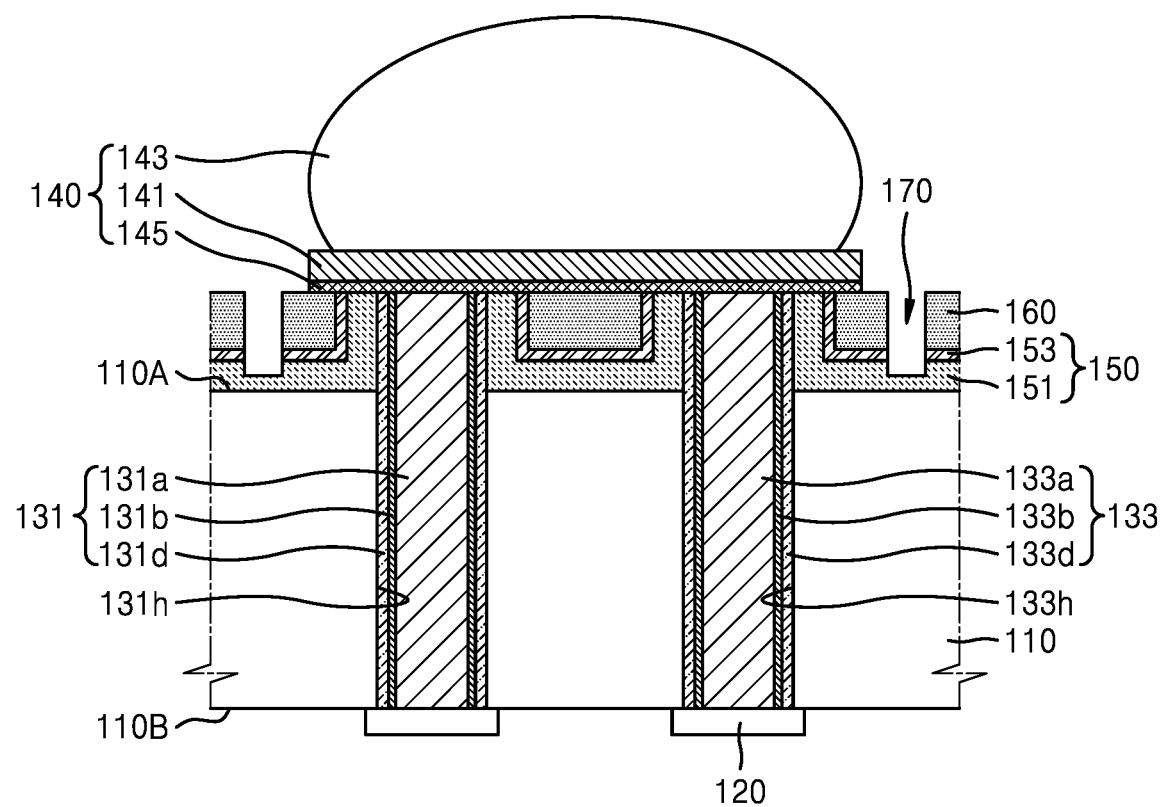

FIGS. 11A through 11R are side cross-sectional views illustrating a method of fabricating the interposer 100, according to an embodiment of the inventive concept.

Referring to FIG. 11A, an etching mask 101 may be formed on the interposer substrate 110 to define positions in which a first through-electrode structure and a second through-electrode structure are to be formed. The etching mask 101 may be a hard mask and/or a photoresist mask, and may be formed by a photolithography process. The hard mask may include, for example, a material such as silicon nitride, a spin-on hard mask (SOH), and an amorphous carbon layer (ACL). The photoresist mask may include a photosensitive polymer. The specific kind of the photosensitive polymer may be determined depending on a wavelength range of exposed light.

Referring to FIG. 11B, by performing anisotropic etching with respect to an exposed portion using the etching mask 101, a first via hole 131h and a second via hole 133h may be formed. CFx-based gas such as $C_4F_8$, etc., as etching gas and additive gas such as Ar, $N_2$, $O_2$, $H_2$, etc., may be used.

In some embodiments of the inventive concept, the first via hole 131h and the second via hole 133h may be performed by deep reactive-ion etching (DRIE) also known as a Bosch process. In some embodiments, a scallop may be formed at least partially on sidewalls of the first via hole 131h and the second via hole 133h.

In some embodiments of the inventive concept, a laser drilling technique may apply to form the first via hole 131h and the second via hole 133h.

Referring to FIG. 11C, a via dielectric material film 131dm and a barrier material film 131bm may be sequentially formed to coat inner sidewalls of the first via hole 131h and the second via hole 133h and bottom surfaces thereof, and the top surface of the interposer substrate 110. The via dielectric material film 131dm may be formed by CVD or PVD. The barrier material film 131bm may be formed by CVD, PVD, or ALD.

Thereafter, a core conductor material film 131am may be formed in a space defined by the barrier material film 131bm. The core conductor material film 131am may be formed by electroplating. For example, the core conductor material film 131am may be formed by forming a metal seed layer on the surface of the barrier material film 131bm, and a conductor film may grow from the metal seed layer by electroplating. The metal seed layer may include Cu, a Cu alloy, Co, Ni, Ru, Co/Cu, or Ru/Cu. The metal seed layer may be formed by PVD. The core conductor material film 131am may include Cu or W. In some embodiments, most of the core conductor material film 131am may be formed of Cu or W.

In some embodiments of the inventive concept, the core conductor material film 131am may include, but not limited to, Cu, CuSn, CuMg, CuNi, CuZn, CuPd, CuAu, CuW, W, or a W alloy. The electroplating process may be performed at a temperature between about 10° C. and about 65° C. In some embodiments of the inventive concept, the electroplating process may be performed at a room temperature. After the core conductor material film 131am is formed, a resultant where the core conductor material film 131am is formed may be annealed at a temperature between about 150° C. and about 450° C.

Referring to FIG. 11D, the core conductor material film 131am, the barrier material film 131bm, and the via dielectric material film 131dm outside the first via hole 131h and the second via hole 133h may be removed by chemical mechanical polishing (CMP). As a result, the first through-electrode structure 131 and the second through-electrode structure 133 defined inside the first via hole 131h and the second via hole 133h may be formed. The first through-electrode structure 131 may be arranged in the first via hole 131h, and may include a first core conductor 131a, a first barrier film 131b, and a first via dielectric film 131d. The second through-electrode structure 133 may be arranged in the second via hole 133h, and may include a second core conductor 133a, a second barrier film 133b, and a second via dielectric film 133d.

Thereafter, the first through-electrode structure 131 and the second through-electrode structure 133 may be thermally treated to reduce roughness on an exposed surface. In some embodiments of the inventive concept, thermal treatment may be performed at a temperature between about 400° C. and about 500° C.

Referring to FIG. 11E, the connection pad 120 may be formed on the exposed surfaces of the first through-electrode structure 131 and the second through-electrode structure 133. For example, the connection pad 120 may be formed on a first end of each of the first through-electrode structure 131 and the second through-electrode structure 133.

The connection pad 120 may include Al, Cu, Au, Ag, Pt, Pd, Ni, Co, W, Zn, or an alloy thereof. In some embodiments of the inventive concept, the connection pad 120 may include copper and may be formed by using a damascene method. For example, after a sacrificial film corresponding to the shape of the connection pad 120 is formed, a copper material film is formed by plating and then is planarized to form the connection pad 120 in a sacrificial film pattern which is then removed, thus forming the connection pad 120 as illustrated in FIG. 11E.

Referring to FIG. 11F, the interposer substrate 110 may be partially removed from the bottom surface such that the first through-electrode structure 131 and the second through-electrode structure 133 protrude from the first main surface 110A of the interposer substrate 110. The interposer substrate 110 may be partially removed from the bottom surface by etchback. For example, the etchback is performed on the bottom surface of the interposer substrate 110 such that the bottom surface is recessed to form the first main surface 110A and to expose a second end.

FIG. 11F illustrates a state where an interposer of FIG. 11E is turned upside down. Thus, while the connection pads 120 are located on the first through-electrode structure 131 and the second through-electrode structure 133 in FIG. 11E, the connection pads 120 may be located under the first through-electrode structure 131 and the second through-electrode structure 133 in FIG. 11F.

Referring to FIG. 11G, a passivation layer 150 may be formed on the first main surface 110A of the interposer substrate 110 and the exposed surfaces of the first through-electrode structure 131 and the second through-electrode structure 133. The passivation layer 150 may include a first passivation layer 151 and a second passivation layer 153 that may be sequentially formed. The first passivation layer 151 and the second passivation layer 153 each may be independently formed by PVD, CVD, or ALD.

The materials of the first passivation layer 151 and the second passivation layer 153 have been described in detail with reference to FIG. 3, and thus will not be described repeatedly.

Referring to FIG. 11H, a photosensitive polymer material film 160m may be formed on the passivation layer 150. The photosensitive polymer material film 160m may have fast-curing property as well as photosensitivity to which the photolithography process is applicable. The photosensitive polymer material film 160m may include, for example, a photoimageable dielectric (PID) material. In some embodiments, the PID material may include, for example, a polyimide-based photosensitive polymer, a novolac-based photosensitive polymer, polybenzoxazole, silicone-based polymer, acrylate-based polymer, or epoxy-based polymer.

The photosensitive polymer material film 160m may be formed by spin coating. The photosensitive polymer material film 160m has high viscosity, such that the top surface of the photosensitive polymer material film 160m may have a higher level than the first through-electrode structure 131 and the second through-electrode structure 133. In some embodiments, a top surface of the photosensitive polymer material film 160m may be uneven. For example, the photosensitive polymer material film 160m may include a first portion on each of the first through-electrode structure 131 and the second through-electrode structure 133 and a second portion on a region therebetween. A top surface of the first portion may be higher than a top surface of the second portion.

Referring to FIG. 11I, an alignment key pattern 170p may be formed in the photosensitive polymer material film 160m. Formation of the alignment key pattern 170p may be performed by selectively exposing the photosensitive polymer material film 160m and developing the same.

In some embodiments of the inventive concept, the alignment key pattern 170p may be formed to pass through the photosensitive polymer material film 160m. In some embodiments of the inventive concept, sidewalls of the alignment key pattern 170p may not be completely perpendicular to the first main surface 110A. This is because a time and an environment in which the photosensitive polymer material film 160m is exposed to an etchant for pattern formation may vary with positions of the sidewalls of the alignment key pattern 170p in the vertical direction. As a result, as shown in FIG. 4, the sidewall 170SW may be formed which is inclined at a certain angle α (e.g., an angle between about 80 degrees and about 88 degrees) with respect to the first main surface 110A.

Thereafter, the photosensitive polymer material film 160m may be cured by being annealed at a temperature between about 80° C. and about 200° C. for a curing time between about 5 seconds and about 5 minutes.

Referring to FIG. 11J, anisotropic etching may be performed using the alignment key pattern 170p as an etching mask, thus partially removing a portion, exposed the alignment key pattern 170p, of the passivation layer 150 or completely removing the portion of the passivation layer 150. Herein, the passivation layer 150 is illustrated as being partially removed.

In some embodiments of the inventive concept, an operation of partially removing the passivation layer 150 by using the alignment key pattern 170p as an etching mask may be omitted.

Although the photosensitive polymer material film 160m above the first through-electrode structure 131 and the second through-electrode structure 133 is illustrated as being removed by anisotropic etching in FIG. 11J, the photosensitive polymer material film 160m may partially remain on the first through-electrode structure 131 and the second through-electrode structure 133 according to circumstances.

Referring to FIG. 11K, end portions (i.e., the second ends) of the first through-electrode structure 131 and the second through-electrode structure 133 may be partially removed and may be partially exposed from the passivation layer 150.

Removal of the end portions may be performed by CMP. The passivation layer 150 on the first through-electrode structure 131 and the second through-electrode structure 133 may be removed by CMP. In some embodiments, the via dielectric films 131d and 133d and the barrier films 131b and 133b on the top ends of the first through-electrode structure 131 and the second through-electrode structure 133 may also be partially removed by CMP.

In some embodiments of the inventive concept, CMP may be performed until the top surface of the photosensitive polymer layer 160, the top surfaces of the first through-electrode structure 131 and the second through-electrode structure 133, and the top surface of the passivation layer 150 surrounding side surfaces of the first through-electrode structure 131 and the second through-electrode structure 133 may become coplanar or on substantially the same plane. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The alignment key 170 may also be formed by CMP.

Referring to FIG. 11L, a seed metal layer 145m may be formed on the exposed surface. The seed metal layer 145m may be formed by, for example, CVD, ALD, or PVD. The seed metal layer 145m may include, for example, Cu, a Cu alloy, Co, Ni, Ru, Co/Cu, or Ru/Cu.

Referring to FIG. 11M, a photoresist material film 180m may be formed on the seed metal layer 145m. The photoresist material film 180m may be, for example, a photoresist material used in a photolithography process, and may be formed to a proper thickness by spin coating.

Referring to FIG. 11N, the photoresist material film 180m may be patterned to expose the seed metal layer 145m at a position where a connection terminal structure is to be formed, thus forming a photoresist pattern 180. Patterning of the photoresist material film 180m may be performed by exposure and development using a photomask having a pattern.

Referring to FIG. 11O, the first conductor layer 141 and a preliminary solder metal layer 143a may then be formed by plating. Plating may be, but not limited to, electroplating. In some embodiments, the first conductor layer 141 and the preliminary solder metal layer 143a may be formed by electroless plating. As shown in FIG. 5, for the first conductor layer 141a of a pillar type, a plating time may be adjusted such that the first conductor layer 141a has sufficiently large vertical dimensions.

Referring to FIG. 11P, the photoresist pattern 180 may be removed. Removal of the photoresist pattern 180 may be performed by, but not limited to, ashing.

Referring to FIG. 11Q, the exposed portion of the seed metal layer 145m may be removed by using the first conductor layer 141 and the preliminary solder metal layer 143a as an etching mask. Removal of the exposed portion of the seed metal layer 145m may be performed by anisotropic etching or wet etching using selective etching liquid.

The exposed surface of the photosensitive polymer layer 160 may be partially removed while the exposed portion of the seed metal layer 145m is removed. In some embodiments of the inventive concept, the top surface of the photosensitive polymer layer 160 may be partially removed while the exposed portion of the seed metal layer 145m is removed, and material delivery of an etching gas or an etchant is more active in a portion away from the first conductor layer 141 than in a portion close to the first conductor layer 141, such that the photosensitive polymer layer 160 may be removed faster. Consequently, as shown in FIG. 4, the thickness of the photosensitive polymer layer 160 may decrease in a direction toward the alignment key pattern 170p, and the top surface 160u of the photosensitive polymer layer 160 may be inclined with respect to the first main surface 110A.

Referring to FIG. 11R, by reflowing the preliminary solder metal layer 143a, the connection terminal structure 140 may be formed. The reflow may be performed at a temperature between about 200° C. and about 280° C. for a reflow time between about 30 seconds and about 10 minutes.

FIGS. 12A through 12J are side cross-sectional views illustrating a method of fabricating an interposer, according to an embodiment described with reference to FIG. 6.

Figure 12A:
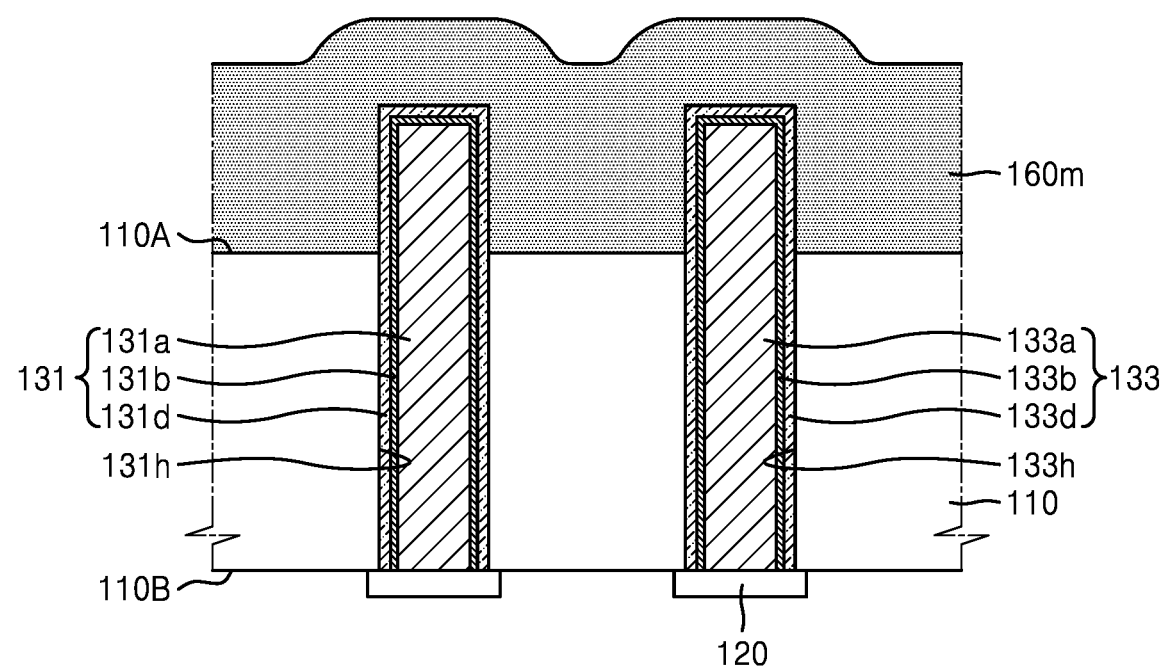
FIGS. 12A through 12J are side cross-sectional views illustrating a method of fabricating an interposer, according to an embodiment described with reference to FIG. 6.

Operations prior to an operation shown in FIG. 12A are common with the operations shown in FIGS. 11A through 11F, and thus will not be described for brevity. The operation shown in FIG. 12A follows the operation shown in FIG. 11F.

Referring to FIG. 12A, the photosensitive polymer material film 160m may be formed on the first main surface 110A, the exposed first through-electrode structure 131, and the second through-electrode structure 133. The photosensitive polymer material film 160m may have fast-curing property as well as photosensitivity to which the photolithography process is applicable, and this matter has already been described with reference to FIG. 11H and thus will not be described in detail at this time.

Figure 12B:
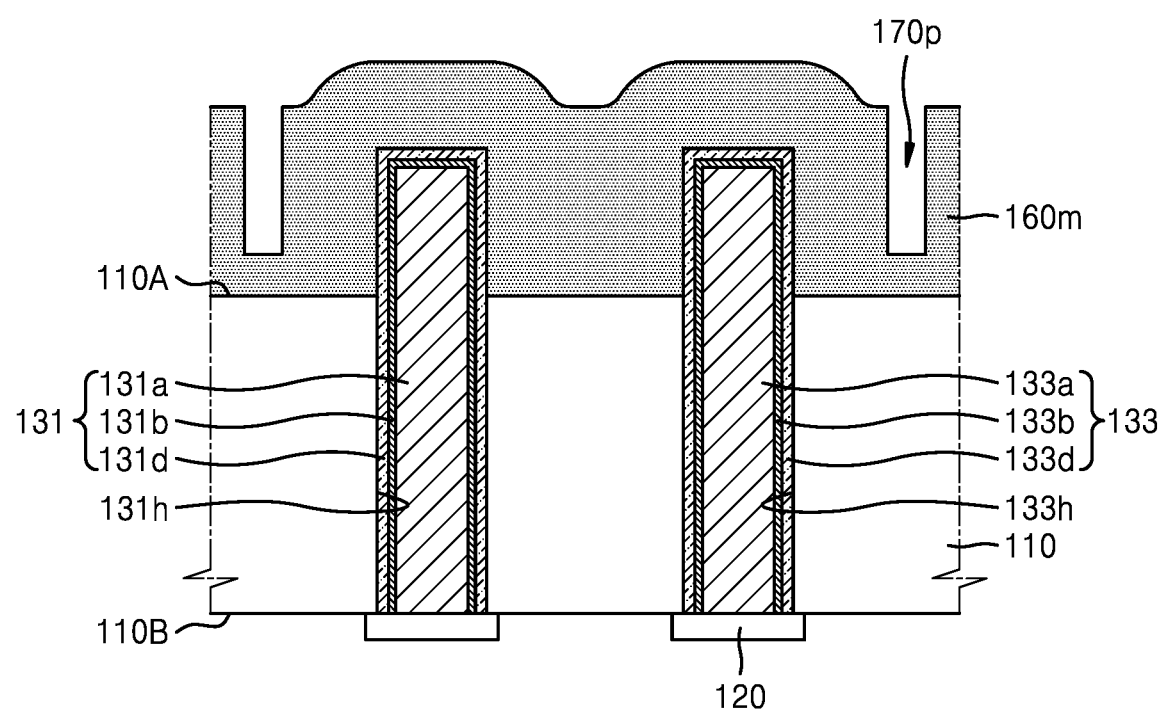

Referring to FIG. 12B, an alignment key pattern 170p may be formed in the photosensitive polymer material film 160m. Formation of the alignment key pattern 170p may be performed by selectively exposing the photosensitive polymer material film 160m and developing the same.

In some embodiments of the inventive concept, the alignment key pattern 170p may be formed to pass through the photosensitive polymer material film 160m.

Thereafter, the photosensitive polymer material film 160m may be cured by being annealed at a temperature between about 80° C. and about 200° C. for a curing time between about 5 seconds and about 5 minutes.

Figure 12C:
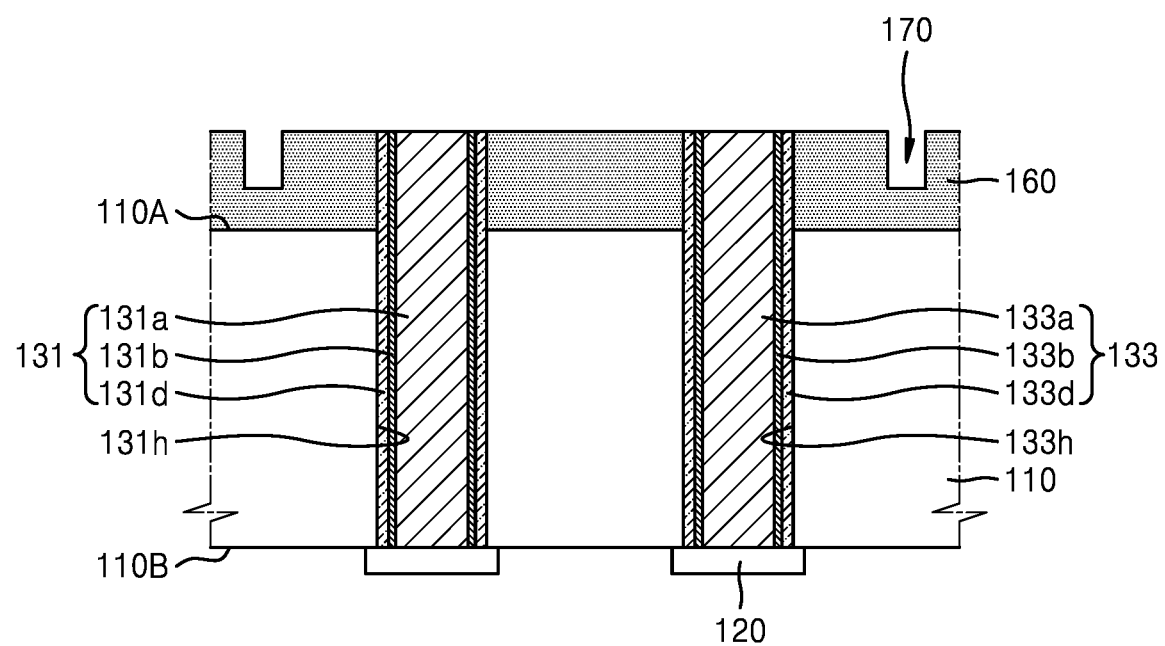

Referring to FIG. 12C, end portions of the first through-electrode structure 131 and the second through-electrode structure 133, and the photosensitive polymer material film 160m may be partially removed to expose the first through-electrode structure 131 and the second through-electrode structure 133 and to form a photosensitive polymer layer 160 from the photosensitive polymer material film 160m.

Removal of the end portions may be performed by CMP. Upper portions of the first through-electrode structure 131 and the second through-electrode structure 133 may be removed by CMP. Moreover, the via dielectric films 131d and 133d and the barrier films 131b and 133b on the top ends of the first through-electrode structure 131 and the second through-electrode structure 133 may also be removed by CMP. The alignment key 170 may also be formed by CMP.

Figure 12D:
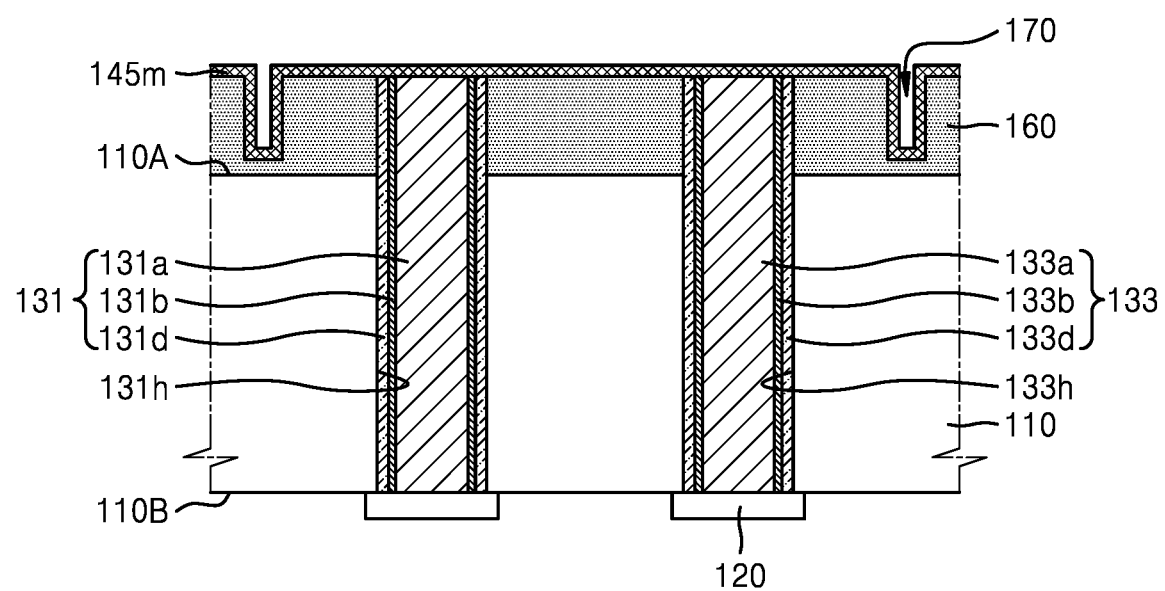

Referring to FIG. 12D, a seed metal layer 145m may be formed on the exposed surface. The seed metal layer 145m may be formed by, for example, CVD, ALD, or PVD. The seed metal layer 145m may include, for example, Cu, a Cu alloy, Co, Ni, Ru, Co/Cu, or Ru/Cu.

Figure 12E:
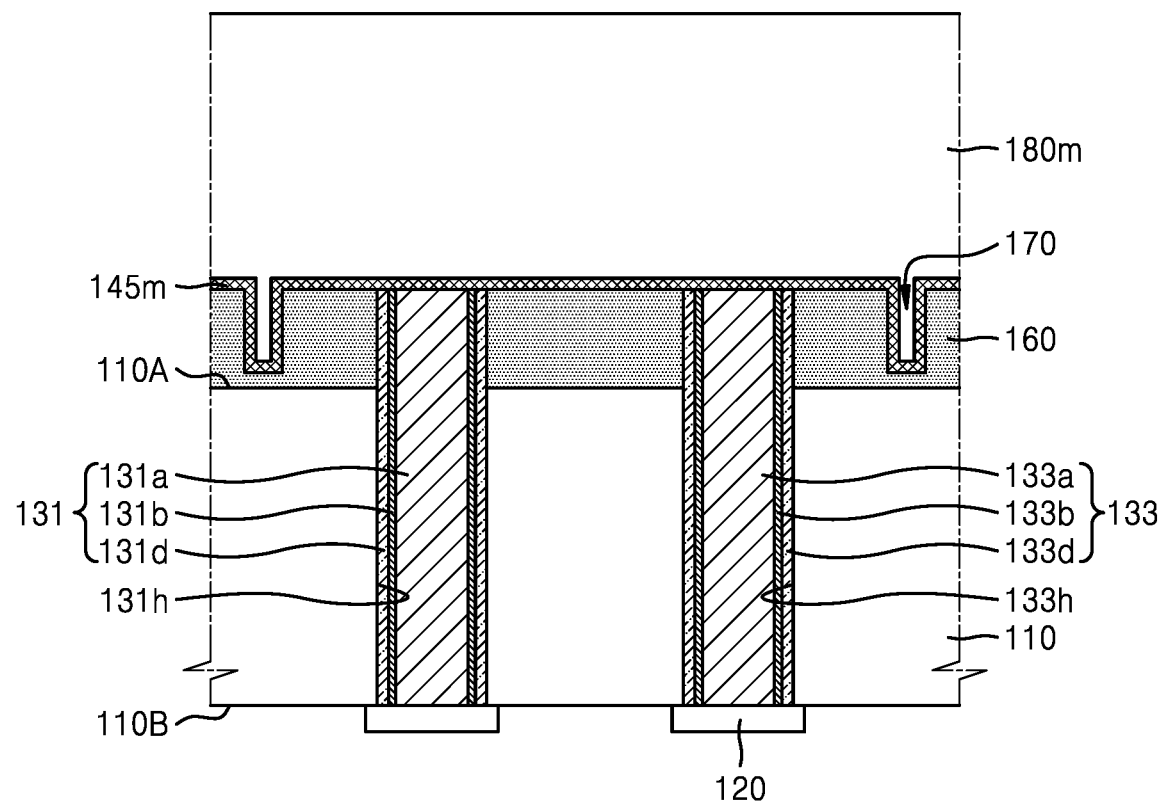

Referring to FIG. 12E, a photoresist material film 180m may be formed on the seed metal layer 145m. The photoresist material film 180m may be, for example, a photoresist material that is used for a photolithography process, and may be formed to a proper thickness by spin coating.

Figure 12F:
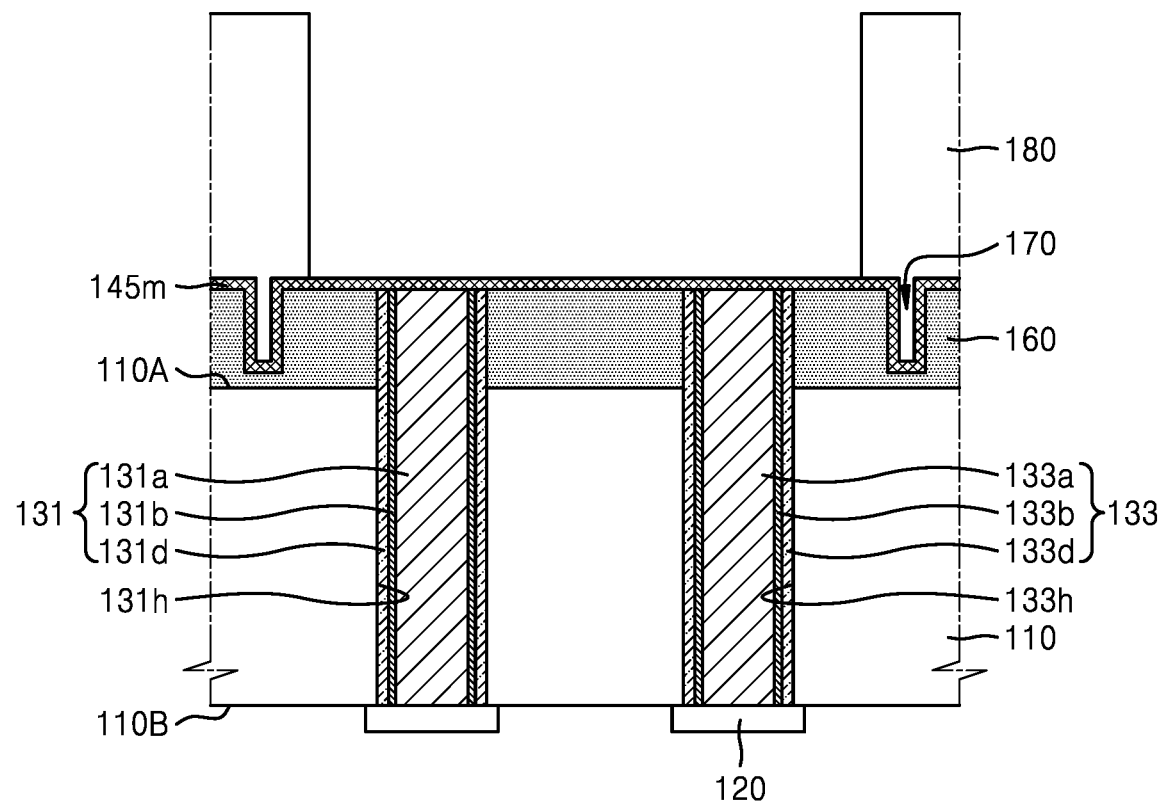

Referring to FIG. 12F, the photoresist material film 180m may be patterned to expose the seed metal layer 145m at a position where a connection terminal structure is to be formed, thus forming the photoresist pattern 180. Patterning of the photoresist material film 180m may be performed by exposure and development using a photomask having a pattern.

Figure 12G:
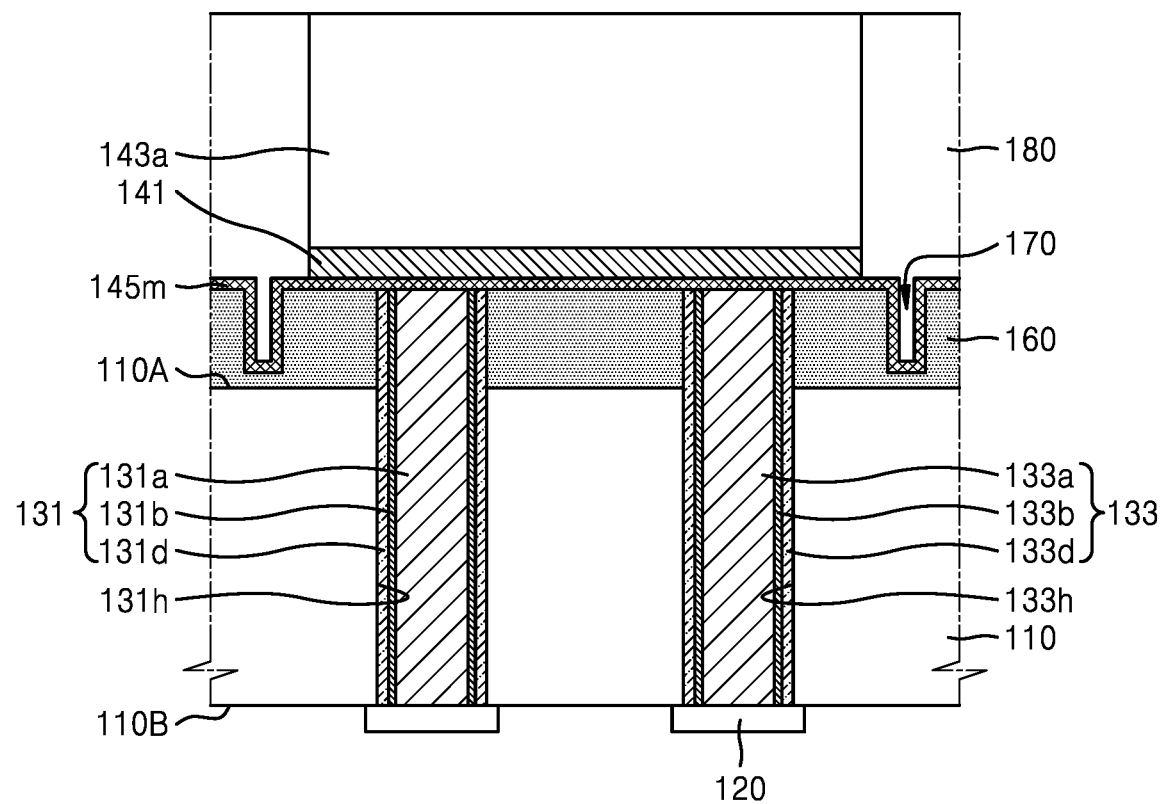

Referring to FIG. 12G, the first conductor layer 141 and the preliminary solder metal layer 143a may then be formed by plating. Plating may be, but not limited to, electroplating. In some embodiments, the first conductor layer 141 and the preliminary solder metal layer 143a may then be formed by electroless plating.

Figure 12H:
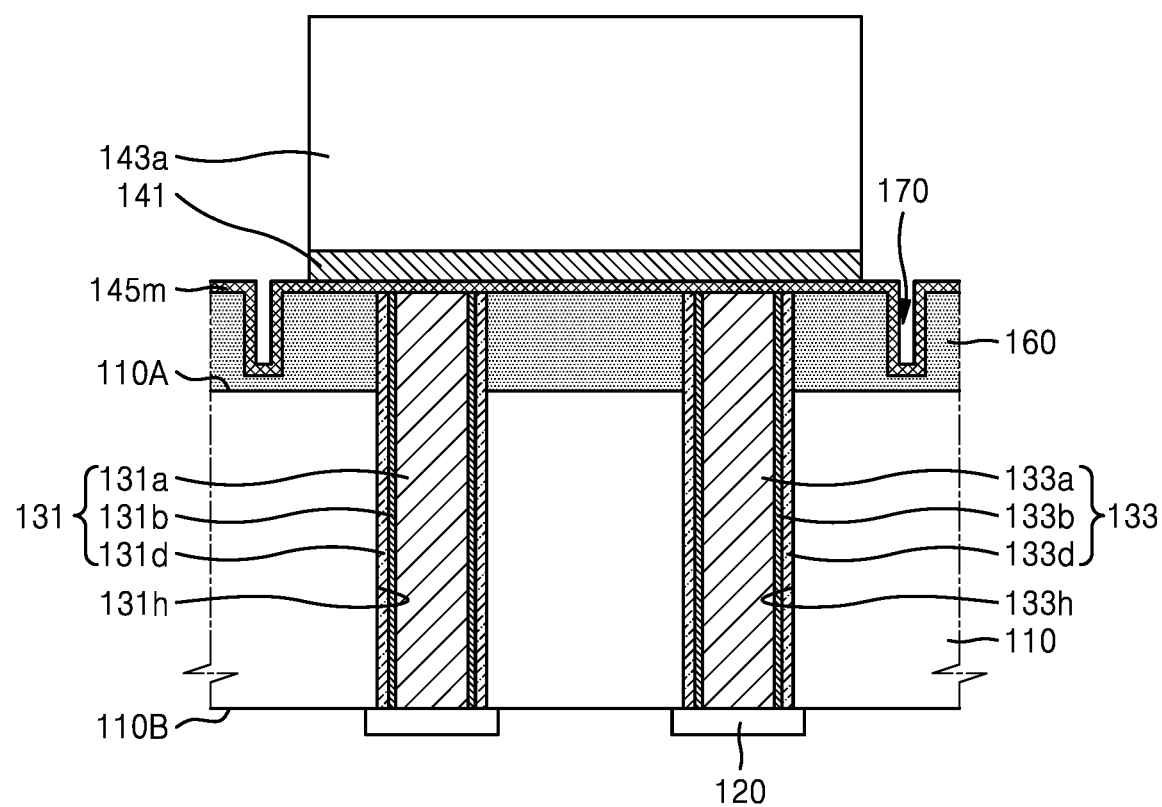

Referring to FIG. 12H, the photoresist pattern 180 may be removed. Removal of the photoresist pattern 180 may be performed by, but not limited to, ashing.

Figure 12I:
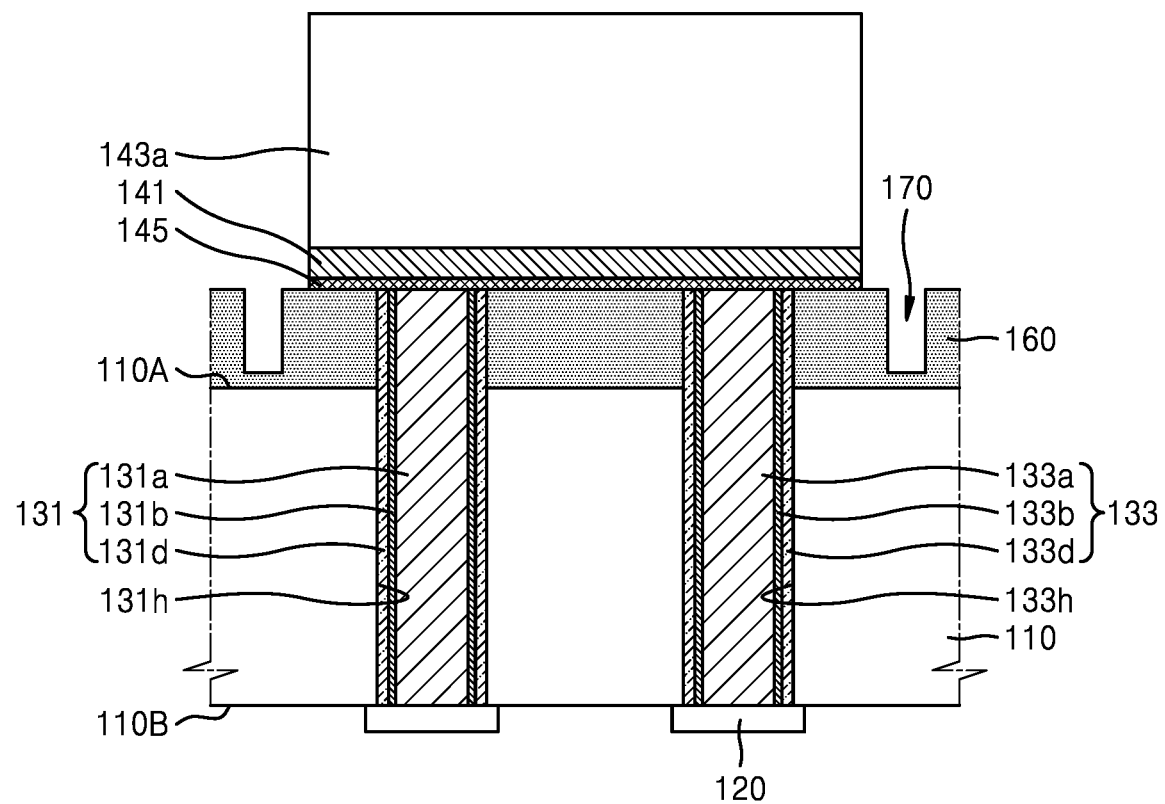

Referring to FIG. 12I, the exposed portion of the seed metal layer 145m may be removed by using the first conductor layer 141 and the preliminary solder metal layer 143a as an etching mask. Removal of the exposed portion of the seed metal layer 145m may be performed by anisotropic etching or wet etching using selective etching liquid.

Figure 12J:
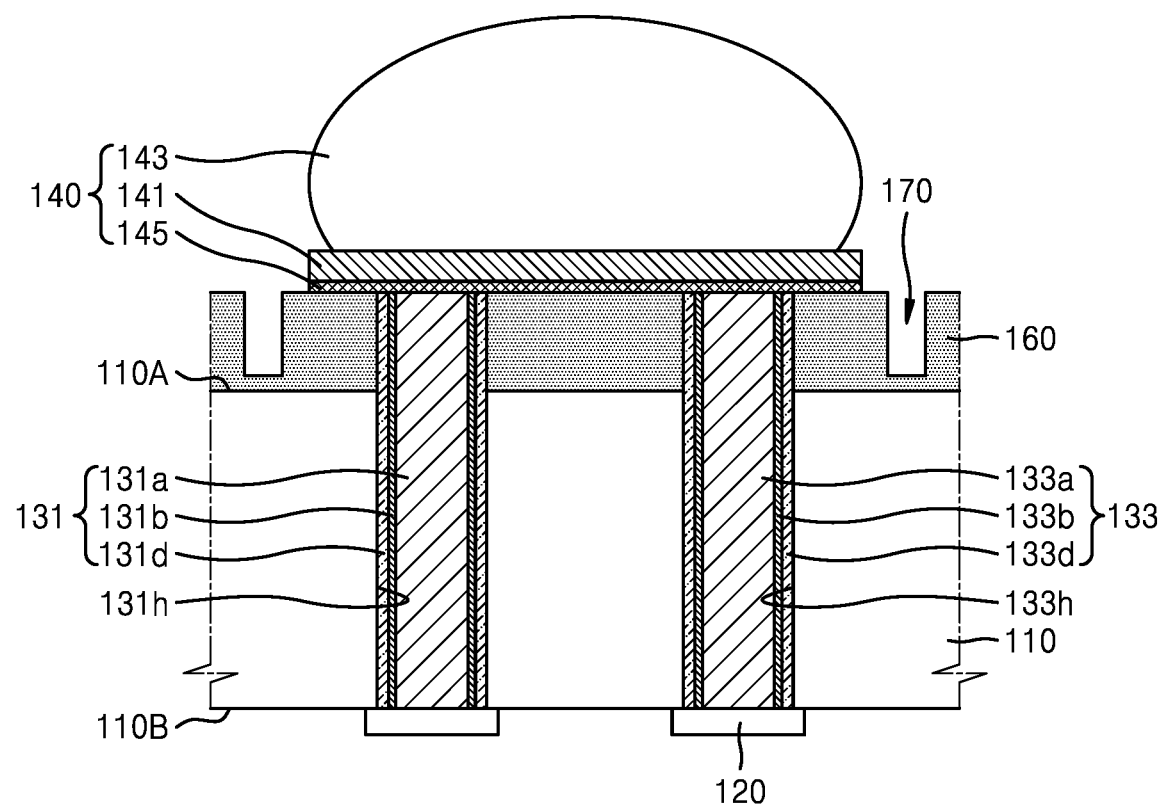

Referring to FIG. 12J, by reflowing the preliminary solder metal layer 143a, the connection terminal structure 140 may be formed. The reflow may be performed at a temperature between about 200° C. and about 280° C. for a reflow time between about 30 seconds and about 10 minutes.

While the inventive concept has been particularly shown and described with reference to embodiments thereof, it will be understood that various changes in form and details may be made therein without departing from the spirit and scope of the following claims.

What is claimed is:

1. An interposer for a semiconductor package, the interposer comprising:
    an interposer substrate comprising a first main surface and a second main surface opposite to the first main surface;
    a first through-electrode structure and a second through-electrode structure, each passing through the interposer substrate and protruding from the first main surface;
    a first passivation layer surrounding a side surface of a protruding portion of the first through-electrode structure and a side surface of a protruding portion of the second through-electrode structure on the first main surface of the interposer substrate, the first passivation layer includes a first material;
    a second passivation layer on the first passivation layer between the first through-electrode structure and the second through-electrode structure, the second passivation layer includes a second material that is different from the first material;
    a connection terminal structure on the first main surface of the interposer substrate, the connection terminal structure contacts a portion of the first passivation layer, a portion of the second passivation layer, an upper surface of the protruding portion of the first through-electrode structure, and an upper surface of the protruding portion of the second through-electrode structure;
    connection pads on the second main surface of the interposer substrate, wherein the connection pads contact lower surfaces of the first through-electrode structure and the second through-electrode structure; and
    a redistribution layer on the connection pads and the second main surface of the interposer substrate.

2. The interposer of claim 1, wherein the upper surface of the protruding portion of the first through-electrode structure, the upper surface of the protruding portion of the second through-electrode structure, an uppermost surface of the first passivation layer, and an upper surface of the second passivation layer are coplanar.

3. The interposer of claim 2,
wherein a lower surface of the connection terminal structure contacts the upper surface of the protruding portion of the first through-electrode structure, the upper surface of the protruding portion of the second through-electrode structure, at least a portion of the uppermost surface of the first passivation layer, and a portion of the upper surface of the second passivation layer.

4. The interposer of claim 2,
wherein the lower surface of the connection terminal structure that contacts the second passivation layer is substantially coplanar with the upper surface of the second passivation layer.

5. The interposer of claim 1,
wherein the redistribution layer includes horizontal wires, contact plugs electrically connecting the horizontal wires to the connection pads, and an interlayer insulating film surrounding each horizontal wire of the horizontal wires and each contact plug of the contact plugs.

6. The interposer of claim 1,
wherein the connection terminal structure comprises a seed metal layer contacting both the first through-electrode structure and the second through-electrode structure, a first conductor layer provided on the seed metal layer, and a solder metal layer provided on the first conductor layer.

7. The interposer of claim 1, further comprising:
an alignment key arranged adjacent to the first through-electrode structure.

8. The interposer of claim 7,
wherein the alignment key passes through the second passivation layer and at least partially passes through the first passivation layer.

9. The interposer of claim 8,
wherein the second passivation layer has a thickness that decreases in a direction toward the alignment key between the alignment key and the first through-electrode structure arranged adjacent to the alignment key.

10. The interposer of claim 8,
wherein the first material is a silicon oxide, a silicon nitride, or a silicon oxynitride, and the second material is a photosensitive polymer.

11. A semiconductor package comprising:
a package substrate having a recess portion;
an interposer in the recess portion;
on the package substrate; and
a first semiconductor device and a second semiconductor device that are arranged to at least partially overlap the interposer,
wherein the interposer comprises:
an interposer substrate comprising a first main surface and a second main surface opposite to the first main surface;
a first through-electrode structure and a second through-electrode structure, each passing through the interposer substrate and protruding from the first main surface;
a first passivation layer on the first main surface of the interposer substrate, the first passivation layer includes a first material;
a second passivation layer on the first passivation layer between the first through-electrode structure and the second through-electrode structure, the second passivation layer includes a second material that is different from the first material; and
a connection terminal structure on the first main surface of the interposer substrate, and wherein the connection terminal structure contacts the first passivation layer, the second passivation layer, the first through-electrode structure, and the second through-electrode structure.

12. The semiconductor package of claim 11,
wherein a top surface of the package substrate is substantially coplanar with a top surface of the interposer.

13. The semiconductor package of claim 11,
wherein the second semiconductor device comprises a memory device including a plurality of stacked memory chips.

14. The semiconductor package of claim 11,
wherein the interposer partially overlaps each of the first semiconductor device and the second semiconductor device.

15. The semiconductor package of claim 11,
wherein the connection terminal structure contacts a protruding portion of the first through-electrode structure and a protruding portion of the second through-electrode structure.

16. A semiconductor package comprising:
a package substrate having a recess portion;
an interposer disposed on the package substrate and having a first surface and a second surface opposite to the first surface;
a first semiconductor device on the first surface of the interposer, the first semiconductor device is accommodated in the recess portion; and
a second semiconductor device on the second surface of the interposer,
wherein the interposer comprises:
an interposer substrate comprising a first main surface and a second main surface opposite to the first main surface;
a first through-electrode structure and a second through-electrode structure, each passing through the interposer substrate and protruding from the first main surface;
a first passivation layer on the first main surface of the interposer substrate, the first passivation layer includes a first material;
a second passivation layer on the first passivation layer between the first through-electrode structure and the second through-electrode structure, the second passivation layer includes a second material that is different from the first material; and
a connection terminal structure on the first main surface of the interposer substrate, and wherein the connection terminal structure electrically connects the interposer to each of the first semiconductor device and the package substrate.

17. The semiconductor package of claim 16,
wherein a lower surface of the connection terminal structure contacts an upper surface of a protruding portion of the first through-electrode structure, and an upper surface of a protruding portion of the second through-electrode structure.

18. The semiconductor package of claim 16,
wherein the interposer further comprises a redistribution layer on the second main surface of the interposer substrate,
wherein the redistribution layer includes horizontal wires, contact plugs electrically connecting the horizontal wires to connection pads, and an interlayer insulating film surrounding each horizontal wire of the horizontal wires and each contact plug of the contact plugs, and wherein the redistribution layer is disposed between the interposer substrate and the second semiconductor device.

19. The semiconductor package of claim 16, wherein the package substrate comprises a base board layer, a top connection pad provided on a top surface of the base board layer, and a bottom connection pad provided on a bottom surface of the base board layer.

20. The semiconductor package of claim 16, wherein the interposer entirely overlaps the first semiconductor device and the second semiconductor device.

* * * * *